(12) United States Patent
Pan et al.

(10) Patent No.: US 11,581,206 B2
(45) Date of Patent: Feb. 14, 2023

(54) CAPACITIVE SENSOR FOR CHAMBER CONDITION MONITORING

(71) Applicant: Applied Materials, Inc., Santa Clara, CA (US)

(72) Inventors: Yaoling Pan, Santa Clara, CA (US); Patrick John Tae, Palo Alto, CA (US); Leonard Tedeschi, San Jose, CA (US); Jennifer Sun, Santa Clara, CA (US); Philip Allan Kraus, San Jose, CA (US); Xiaopu Li, San Jose, CA (US); Kallol Bera, San Jose, CA (US); Michael D. Willwerth, Campbell, CA (US); Albert Barrett Hicks, III, Santa Clara, CA (US); Lisa J. Enman, Sunnyvale, CA (US); Mark Joseph Saly, Milpitas, CA (US); Daniel Thomas McCormick, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 139 days.

(21) Appl. No.: 16/812,066

(22) Filed: Mar. 6, 2020

(65) Prior Publication Data
US 2021/0280443 A1 Sep. 9, 2021

(51) Int. Cl.
*H01L 21/67* (2006.01)
*G01N 27/22* (2006.01)
*G05B 19/418* (2006.01)

(52) U.S. Cl.
CPC ..... *H01L 21/67276* (2013.01); *G01N 27/226* (2013.01); *G01N 27/228* (2013.01);
(Continued)

(58) Field of Classification Search
USPC .............. 324/658, 660–663, 750.03, 750.04
See application file for complete search history.

(56) References Cited

U.S. PATENT DOCUMENTS

| | | | |
|---|---|---|---|
| 5,973,502 A | * 10/1999 | Bailleul | G01B 7/14 324/662 |
| 8,226,769 B2 | 7/2012 | Matyushkin et al. | |

(Continued)

FOREIGN PATENT DOCUMENTS

| | | |
|---|---|---|
| JP | 2004061305 A | 2/2004 |
| JP | 2004279370 A | 10/2004 |

(Continued)

OTHER PUBLICATIONS

International Search Report and Written Opinion from PCT/US2021/013964 dated May 14, 2021, 11 pgs.

(Continued)

*Primary Examiner* — Vincent Q Nguyen
(74) *Attorney, Agent, or Firm* — Schwabe, Williamson & Wyatt, P.C.

(57) ABSTRACT

Embodiments disclosed herein comprise a sensor. In an embodiment, the sensor comprises a substrate having a first surface and a second surface opposite from the first surface. In an embodiment, the sensor further comprises a first electrode over the first surface of the substrate, and a second electrode over the first surface of the substrate and adjacent to the first electrode. In an embodiment, the sensor further comprises a barrier layer over the first electrode and the second electrode.

13 Claims, 15 Drawing Sheets

(52) U.S. Cl.
CPC ............... *G05B 19/41875* (2013.01); *G05B 2219/32177* (2013.01)

(56) References Cited

U.S. PATENT DOCUMENTS

| | | | |
|---|---|---|---|
| 8,287,650 B2 | 10/2012 | Lee et al. | |
| 8,633,423 B2 | 1/2014 | Lin et al. | |
| 9,074,285 B2* | 7/2015 | Pease | H05H 1/0081 |
| 2006/0180570 A1* | 8/2006 | Mahoney | H01J 37/32935 |
| | | | 216/59 |
| 2012/0025851 A1* | 2/2012 | Homeijer | G01D 5/2415 |
| | | | 324/686 |
| 2013/0023794 A1* | 1/2013 | Stein | A61B 5/1076 |
| | | | 600/587 |
| 2013/0087286 A1 | 4/2013 | Carducci et al. | |
| 2013/0181727 A1* | 7/2013 | Nishizawa | G06F 3/0446 |
| | | | 324/658 |
| 2015/0061049 A1* | 3/2015 | Weber | H01L 29/66007 |
| | | | 257/417 |
| 2015/0199045 A1* | 7/2015 | Robucci | G06F 3/0346 |
| | | | 345/174 |
| 2016/0003758 A1* | 1/2016 | Hong | G01N 27/223 |
| | | | 324/664 |
| 2017/0365531 A1* | 12/2017 | Tedeschi | H01L 22/26 |
| 2018/0323373 A1* | 11/2018 | Kersschot | B41J 2/01 |
| 2018/0374764 A1 | 12/2018 | Tedeschi et al. | |
| 2019/0267993 A1* | 8/2019 | Sawada | G01V 3/08 |
| 2020/0378915 A1* | 12/2020 | Yamamoto | G01N 27/226 |

FOREIGN PATENT DOCUMENTS

| | | |
|---|---|---|
| JP | 2017183683 A | 10/2017 |
| WO | 2018108242 A1 | 6/2018 |

OTHER PUBLICATIONS

Preliminary Report on Patentability from PCT Application No. PCT/US2021/013964 dated Sep. 15, 2022, 7 pgs.

* cited by examiner

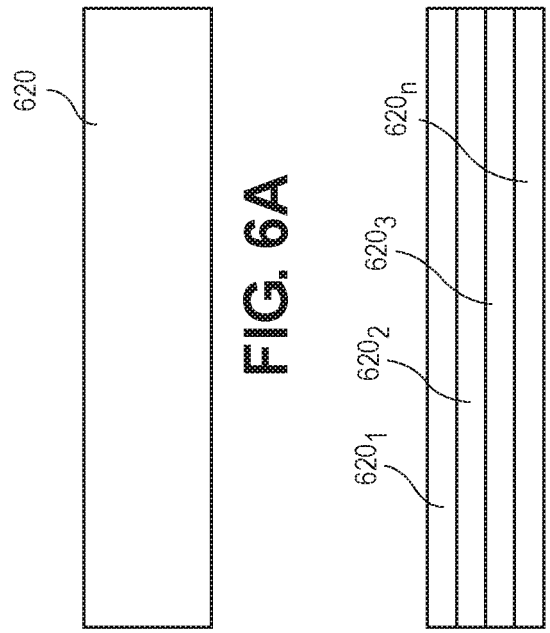
FIG. 6A
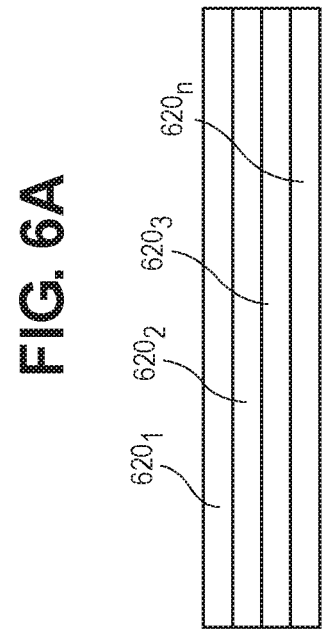
FIG. 6B
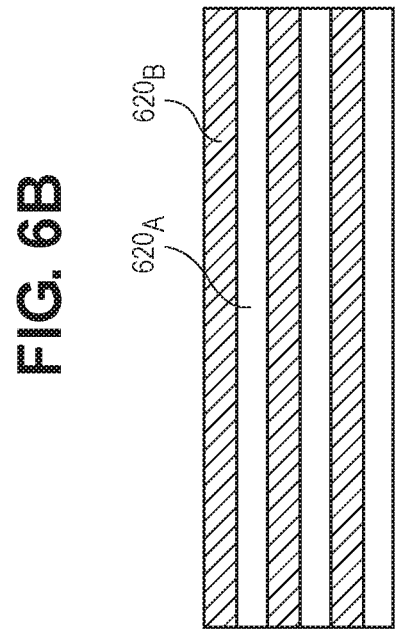
FIG. 6C
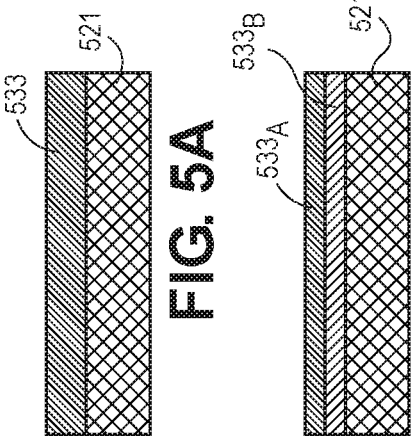
FIG. 5A
FIG. 5B
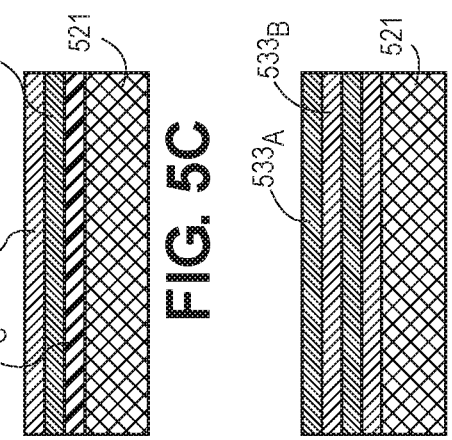
FIG. 5C
FIG. 5D

CAPACITIVE SENSOR FOR CHAMBER CONDITION MONITORING

BACKGROUND

1) Field

Embodiments relate to the field of semiconductor manufacturing and, in particular, to capacitive sensors for monitoring chamber conditions.

2) Description of Related Art

The fabrication of microelectronic devices, display devices, micro-electromechanical systems (MEMS), and the like require the use of one or more processing chambers. For example, processing chambers such as, but not limited to, a plasma etch chamber, a plasma enhanced chemical vapor deposition chamber, a physical vapor deposition chamber, a plasma treatment chamber, or an ion implantation chamber may be used to fabricate various devices. As scaling continues to drive to smaller critical dimensions in such devices, the need for uniform and stable processing conditions (e.g., uniformity across a single substrate, uniformity between different lots of substrates, and uniformity between chambers in a facility) is becoming more critical in high volume manufacturing (HVM) environments.

Processing non-uniformity or instability arises from many different sources. One such source is the condition of the chamber itself. That is, as substrates are processed in a chamber, the chamber environment may change. For example, in an etching process, etch byproducts may be deposited on the interior surfaces of a chamber as a result of a redeposition process. The buildup of a redeposition layer on the interior surfaces of the chamber can alter the plasma chemistry in subsequent iterations of a process recipe and result in process drift.

To combat process drift, the processing chamber may be cleaned periodically. An in-situ chamber clean (ICC) may be implemented to reset the chamber condition. Currently, ICCs are primarily recipe based. That is, a set recipe is executed in order to clean the processing chamber. Some ICCs may use an optical emission spectrometry (OES) system for end-point determination of the process recipe. However, there is no way to directly measure the condition (e.g., the thickness of the redeposition layer, thickness of a seasoning layer, etc.) of interior surfaces of the processing chamber.

The processing chamber may also be opened in order to manually clean portions of the processing chamber or to replace worn consumables within the processing chamber. However, opening a processing chamber results in significant down time since the processing chamber needs to be pumped back down to the desired vacuum pressure, seasoned, and the chamber needs to be revalidated before production substrates can be processed. Opening of the processing chamber may occur at predetermined intervals (e.g., after a certain number of substrates have been processed) or after an excursion is detected. Relying on predetermined intervals may result in opening the chamber too often. As such, the throughput is decreased. In the case of excursion detection, correction of the chamber condition is made after damage to production substrates has already occurred. As such, yield is decreased.

SUMMARY

Embodiments disclosed herein comprise a sensor. In an embodiment, the sensor comprises a substrate having a first surface and a second surface opposite from the first surface. In an embodiment, the sensor further comprises a first electrode over the first surface of the substrate, and a second electrode over the first surface of the substrate and adjacent to the first electrode. In an embodiment, the sensor further comprises a barrier layer over the first electrode and the second electrode.

Embodiments disclosed herein may also comprise a sensor module. In an embodiment, the sensor module comprises a sensor substrate with a first surface and a second surface opposite from the first surface. In an embodiment, a first electrode is over the first surface of the sensor substrate, and a second electrode is over the first surface of the sensor substrate and adjacent to the first electrode. In an embodiment, the sensor module further comprises a capacitance-to-digital converter (CDC) that is electrically coupled to the first electrode and the second electrode.

Embodiments may also comprise a processing tool. In an embodiment, the processing tool comprises a chamber defining an interior volume, wherein the interior volume comprises a processing region and an evacuation region. In an embodiment, the chamber may further comprise a lid to seal the chamber, and a substrate support within the processing region. The substrate support may be for supporting a substrate and a process ring. In an embodiment, the processing tool may further comprise a capacitive sensor within the interior volume. In an embodiment, the capacitive sensor comprises a substrate having a first surface and a second surface opposite from the first surface, a first electrode over the first surface of the substrate, and a second electrode over the first surface of the substrate and adjacent to the first electrode. In an embodiment, the capacitive sensor may further comprise a barrier layer over the first electrode and the second electrode.

BRIEF DESCRIPTION OF THE DRAWINGS

FIG. 5A is a cross-sectional illustration of a barrier layer over an electrode, in accordance with an embodiment.

FIG. 5B is a cross-sectional illustration of a barrier layer comprising a first layer and a second layer over an electrode, in accordance with an embodiment.

FIG. 5C is a cross-sectional illustration of a barrier layer that comprises a first layer, a second layer, and a third layer over an electrode, in accordance with an embodiment.

FIG. 5D is a cross-sectional illustration of a barrier layer that comprises alternating first layers and second layers over an electrode, in accordance with an embodiment.

FIG. 6A is a cross-sectional illustration of a monolithic substrate on which a capacitive sensor is formed, in accordance with an embodiment.

FIG. 6B is a cross-sectional illustration of a substrate on which a capacitive sensor is formed that comprises a plurality of layers, in accordance with an embodiment.

FIG. 6C is a cross-sectional illustration of a substrate on which a capacitive sensor is formed that comprises a plurality of alternating first and second layers, in accordance with an embodiment.

DETAILED DESCRIPTION

Figure 1:
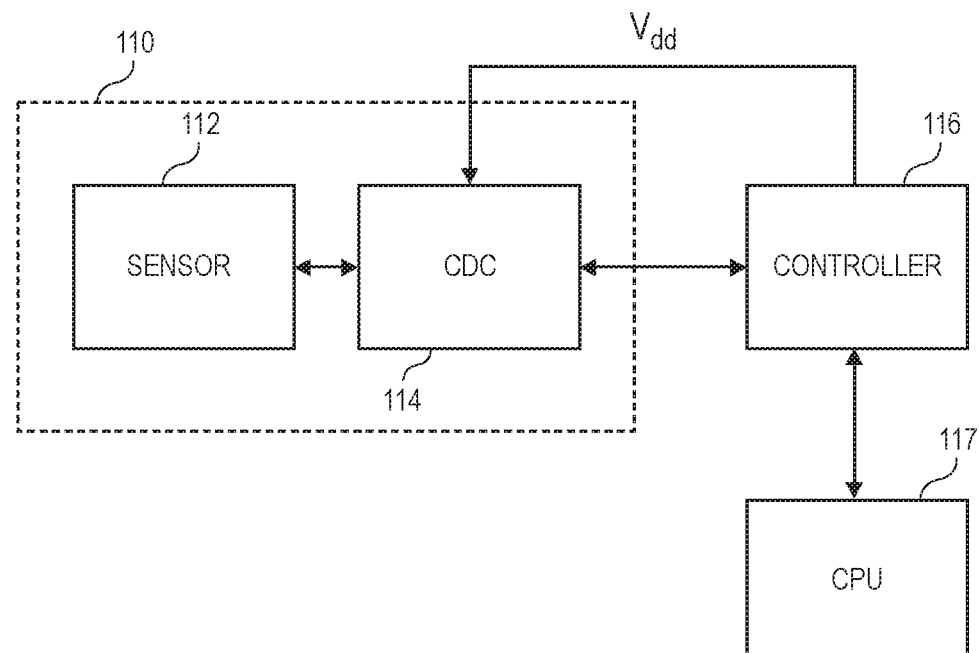
FIG. 1 is a schematic diagram of a sensor module and the communication network between the sensor module and a computing device, in accordance with an embodiment.

Systems and methods described herein include capacitive sensors for monitoring chamber conditions. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, changes to the chamber condition may impact process uniformity (e.g., uniformity across a single substrate, uniformity between different lots of substrates, and uniformity between chambers in a facility). Accordingly, it is desirable to monitor the chamber conditions within a processing tool in order to improve process uniformity. Embodiments disclosed herein include capacitive sensor modules that may be integrated into the processing tool in order to monitor one or more chamber conditions.

One chamber condition that may be monitored is the deposition of materials (e.g., redeposition of etch byproducts) onto the interior surfaces of the chamber. Such redeposition layers may result in changes to the plasma chemistry and, therefore, may result in process non-uniformities and process drifting. Additionally, a seasoning layer may be disposed over interior surfaces of the chamber for some processes. Changes to the seasoning layer may also result in process non-uniformities and process drifting. As such, it is desirable to monitor changes to the seasoning layer. An additional chamber condition that may be monitored in order to limit process non-uniformities is the temperature of various components within the chamber (e.g., chamber wall temperature, showerhead temperature, etc.). Additionally, one or more components within a chamber may be considered consumable components. That is, during the operation of the chamber, various components may be worn and eventually need to be replaced. For example, a process ring may be one such consumable component. As such, it is also desirable to monitor the degree of erosion of such consumable components in order to determine when replacement is necessary in order to maintain high process uniformity.

The use of capacitive sensor modules in accordance with embodiments disclosed herein allow for monitoring of such chamber conditions. The capacitive sensor modules disclosed herein allow for high precision measurement of the various chamber conditions. Changes in the capacitance of the sensor module is detected when material (e.g., etch byproducts) is deposited over electrodes of the capacitive sensor. Alternatively, removal of material (e.g., during an ICC process, erosion of chamber components during processes) may be measured by changes in capacitance.

The capacitive sensor modules disclosed herein may be positioned in one or more different locations of the processing tool in order to provide chamber condition measurements for various components. For example, a sensor module may be positioned along a chamber wall, in an evacuation region, integrated with a lid assembly, and/or proximate to a process ring around the substrate. Embodiments disclosed herein include sensor modules that are able to withstand the environmental conditions within a processing chamber. For example, the sensor modules may be protected by a barrier layer that is substantially etch resistant. Furthermore, the barrier layer may also be fluorination resistant in order to improve signal integrity. That is, without fluorination resistance, fluorine that diffuses into the barrier layer will cause changes in the capacitance of the sensor module. The sensor module may also be compatible with elevated processing temperatures (e.g., approximately 400° C. or greater). Additionally, the sensor module is formed with materials that limit cross contamination and/or particle generation.

Furthermore, the capacitive sensor modules allow for real time monitoring of the chamber conditions. This is because electrical feeds through chamber walls, such as vacuum electrical feedthroughs, allow for output from the sensor modules to be monitored during processing in the chamber. Real time monitoring allows for feedforward adjustments to be made to processing recipes in order to account for existing process non-uniformities.

Referring now to FIG. 1, a schematic illustration of a sensor module 110 is shown, in accordance with an embodiment. In an embodiment, the sensor module 110 comprises a sensor 112 and a capacitance-to-digital converter (CDC) 114. The sensor 112 is a capacitive sensor or capacitive sensor integrated with thermal (temperature) sensor. That is, the output from the sensor 112 is a capacitance or capacitance and temperature. The capacitance output may then be converted to a digital signal by the CDC for further processing. The CDC may be implemented on an ASIC die. In an embodiment, the sensor module 110 is controlled by a controller 116. The controller 116 may also provide power (i.e., $V_{dd}$) to the sensor module 110. The controller 116 may be communicatively coupled to a computing device 117 or integrated into the computing device 117. The computing device 117 may control the operation of a processing tool that is being monitored by the sensor module 110. As such, a capacitance or capacitance and temperature output from the sensor 112 may be used to alter process recipes, cleaning schedules, or the like to account for chamber condition non-uniformities.

Figure 2A:
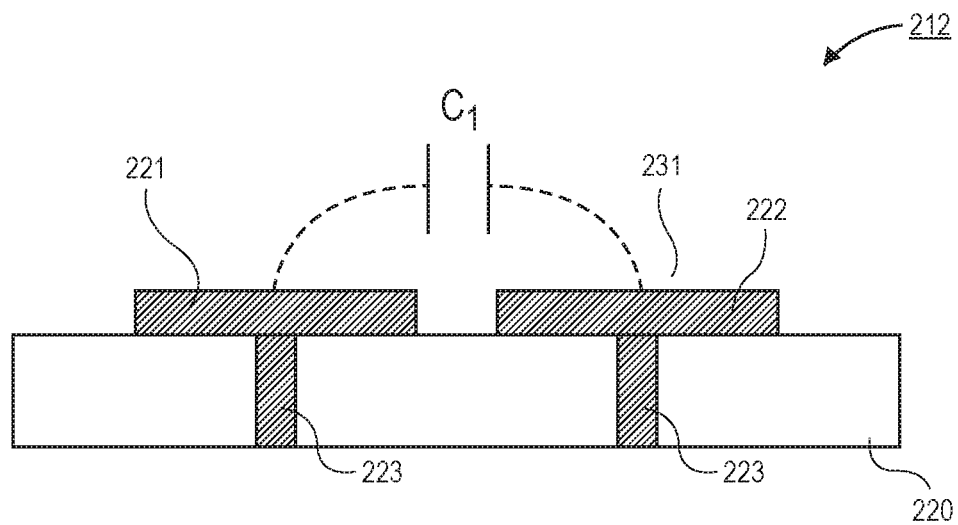
FIG. 2A is a schematic diagram of a capacitive sensor, in accordance with an embodiment.

Referring now to FIG. 2A, a cross-sectional illustration of a an exemplary sensor 212 is shown, in accordance with an embodiment. In an embodiment, the sensor 212 may be integrated on a substrate 220. A first electrode 221 and a second electrode 222 may be positioned over the substrate 220. In an embodiment, the first electrode 221 may be a sense electrode and the second electrode 222 may be a drive electrode. Vias 223 may connect the first electrode 221 and the second electrode 222 to opposite surfaces of the substrate 220.

Applying voltage to the first electrode 221 and the second electrode 222 generates charge across the capacitor $C_1$ between the first electrode 221 and the second electrode 222. The capacitance of $C_1$ is dependent on different factors, such as, the geometry of the first electrode 221 and the second electrode 222, the spacing between the first electrode 221 and the second electrode 222, and the presence (or absence) of material over the first electrode 221 and the second electrode 222.

Figure 2B:
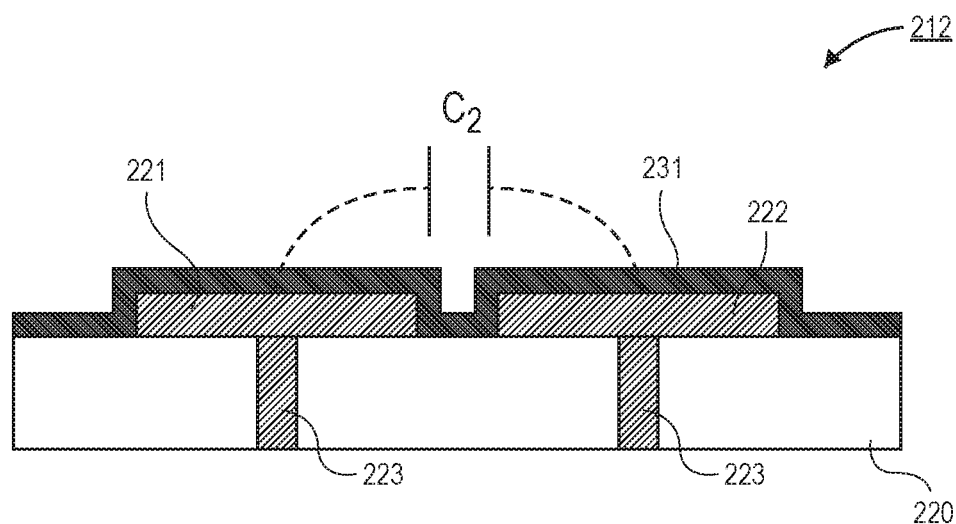
FIG. 2B is a schematic diagram of a capacitive sensor with a layer deposited over the capacitive sensor, in accordance with an embodiment.

Referring now to FIG. 2B, a cross-sectional illustration of the sensor 212 after a layer 231 has been disposed over the first electrode 221 and the second electrode 222 is shown, in accordance with an embodiment. The layer 231 may be the result of any processing operation in a chamber. For example, the layer 231 may be a redeposition of etch byproducts during an etching process. The layer 231 alters the electric field between the first electrode 221 and the second electrode 222, and therefore, changes the first capacitance $C_1$ to a second capacitance $C_2$. A change in capacitance is an indication that there has been a change in the chamber condition. Similar to the addition of material (e.g., the deposition of the layer 231), embodiments may also detect the removal of material. For example, as portions of the layer 231 are removed, the capacitance will change from the second capacitance $C_2$. The detection of the removal of material is particularly beneficial in the case of ICC operations, the monitoring of ware of consumable components, or changes to a seasoning layer.

Depending on the design of the first electrode 221 and the second electrode 222, the resolution of the sensor 212 may be approximately 10 aF or smaller, and have an accuracy of approximately 100 aF or smaller. Accordingly, small changes in the chamber condition may be detected by sensors 212 such as those described herein.

In order to provide a desired resolution and accuracy, embodiments disclosed herein may include several different electrode configurations. For example, FIGS. 3A-3F provide several electrode implementations that may be used in a sensor 312.

Figure 3A:
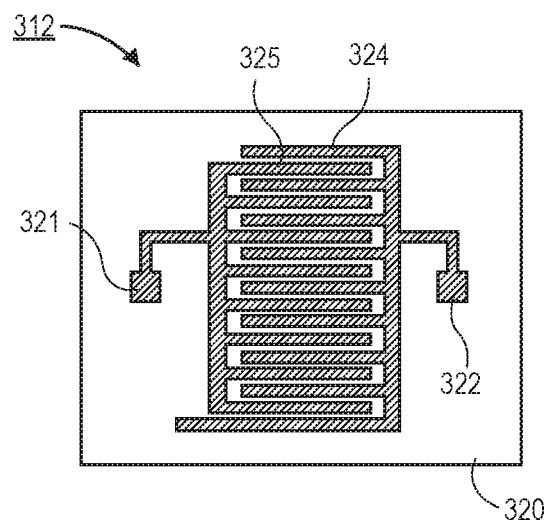
FIG. 3A is a plan view illustration of a capacitive sensor with a first electrode and a second electrode with interdigitated fingers, in accordance with an embodiment.

Referring now to FIG. 3A, a plan view illustration of a sensor 312 is shown, in accordance with an embodiment. The sensor 312 may comprise a substrate 320, a first electrode 321 over the substrate 320, and a second electrode 322 over the substrate 320. In an embodiment, the first electrode 321 may comprise a plurality of first fingers 325 and the second electrode 322 may comprise a plurality of second fingers 324. The first fingers 325 may be interdigitated with the second fingers 324. The use of interdigitated fingers provides an increased surface area between the first electrode 321 and the second electrode 322, which allows for higher capacitance values.

Figure 3B:
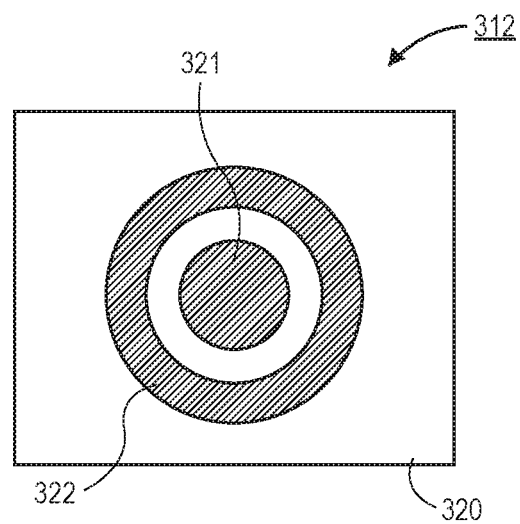
FIG. 3B is a plan view illustration of a capacitive sensor with a first electrode surrounded by a second electrode, in accordance with an embodiment.

Referring now to FIG. 3B, a plan view illustration of a sensor 312 is shown, in accordance with an additional embodiment. In an embodiment, the sensor 312 may comprise a substrate 320, a first electrode 321 over the substrate 320, and a second electrode 322 over the substrate 320. The first electrode 321 may be a pad or the like, and the second electrode 322 may be a ring that surrounds a perimeter of the first electrode 321.

Figure 3C:
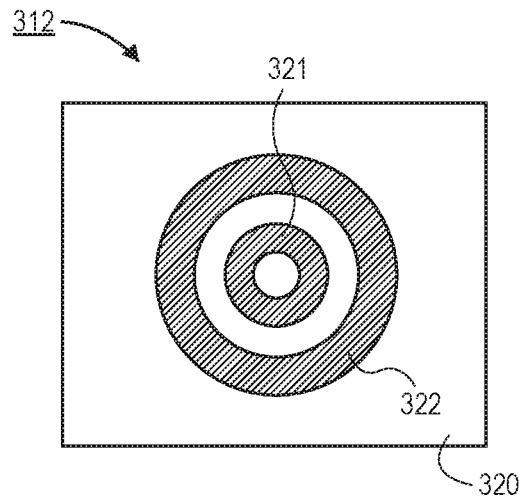
FIG. 3C is a plan view illustration of a capacitive sensor with a first ring electrode surrounded by a second ring electrode, in accordance with an embodiment.

Referring now to FIG. 3C, a plan view illustration of a sensor 312 is shown, in accordance with an additional embodiment. In an embodiment, the sensor 312 may comprise a substrate 320, a first electrode 321 over the substrate 320, and a second electrode 322 over the substrate 320. The first electrode 321 and the second electrode 322 may both be rings in some embodiments.

In FIGS. 3B and 3C, the first electrodes 321 and the second electrodes 322 are shown as having substantially circular shapes. However, it is to be appreciated that embodiments are not limited to such configurations. That is, the outer perimeter (and the inner perimeter in the case of a ring) may be any shape (e.g., square, rectangular, any polygon, or any other shape).

Figure 3D:
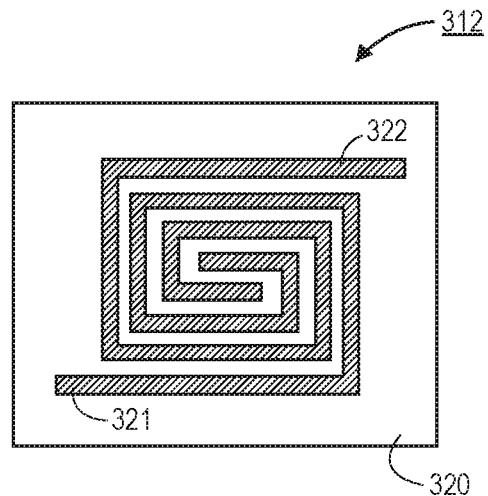
FIG. 3D is a plan view illustration of a capacitive sensor with a first electrode and a second electrode in an interlocking spiral configuration, in accordance with an embodiment.

Referring now to FIG. 3D, a plan view illustration of a sensor 312 is shown, in accordance with an additional embodiment. In an embodiment, the sensor 312 may comprise a substrate 320, a first electrode 321 over the substrate 320, and a second electrode 322 over the substrate 320. The first electrode 321 and the second electrode 322 may each have a spiral shape, and the spiral of the first electrode 321 may be interlocking with the spiral of the second electrode 321. In the illustrated embodiment, the spirals have turns that are substantially ninety degrees. However, it is to be appreciated that the spirals may be curved with no discernable corners, or the corners may have angles other than ninety degrees.

Figure 3E:
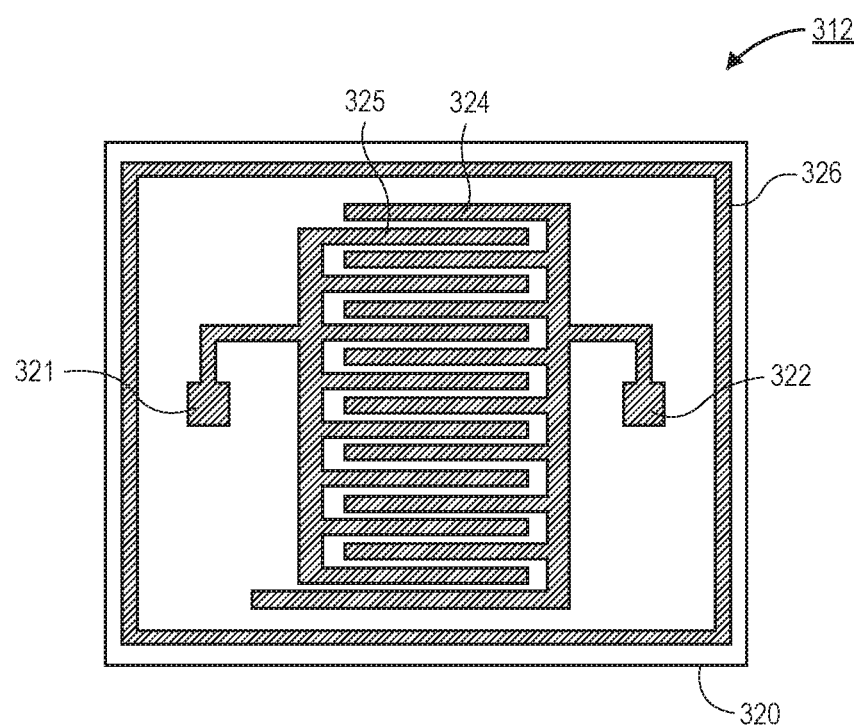
FIG. 3E is a plan view illustration of a capacitive sensor with a first electrode, a second electrode, and a guard ring around the first electrode and the second electrode, in accordance with an embodiment.

Referring now to FIG. 3E, a plan view illustration of a sensor 312 is shown, in accordance with an additional embodiment. In an embodiment, the sensor 312 comprises a substrate 320, a first electrode 321 over the substrate, a second electrode 322 over the substrate, and a guard ring 326 around a perimeter of the first electrode 321 and the second electrode 322. The guard ring 326 may provide enhanced electrical isolation for sensor 312, and therefore, reduce the noise and improve performance of the sensor 312. In an embodiment, the guard ring 326 is held at a substantially steady potential. For example, the guard ring 326 may be held at ground potential. In an additional embodiment, the guard ring can be at a floating voltage.

In the illustrated embodiment, the guard ring 326 is shown around a first electrode 321 and a second electrode 322 with interdigitated first fingers 325 and second fingers 324. However, it is to be appreciated that similar guard rings 326 may be provided around any capacitor configuration, such as those described with respect to FIGS. 3B-3D.

Figure 3F:
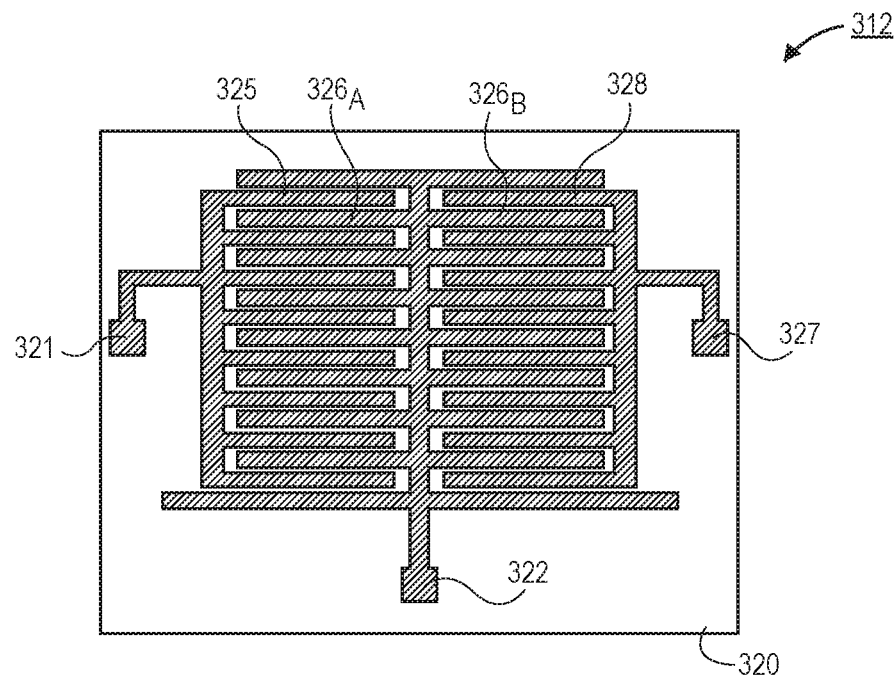
FIG. 3F is a plan view illustration of a capacitive sensor with a differential capacitor comprising a first electrode, a second electrode, and a third electrode, in accordance with an embodiment.

Referring now to FIG. 3F, a plan view illustration of a sensor 312 is shown, in accordance with an additional embodiment. Particularly, the sensor 312 in FIG. 3F is a differential capacitor sensor 312. The use of differential capacitors may allow for improved noise reduction. In an embodiment, the sensor 312 comprises a substrate 320, a first electrode 321 over the substrate 320, a second electrode 322 over the substrate 320, and a third electrode 327 over the substrate. The second electrode 322 may be a drive electrode and the first electrode 321 and the third electrode 327 may be sense electrodes. The pair of sense electrodes (i.e., the first electrode 321 and the third electrode 327) may both reference the drive electrode (i.e., the second electrode 322).

In an embodiment, the first electrode 321 may have first fingers 325 and the third electrode 327 may have third fingers 328. The first fingers 325 may be interdigitated with second fingers $326_A$ of the second electrode 322, and the third fingers $325_B$ may be interdigitated with second fingers $326_B$ of the second electrode 322. However, it is to be appreciated that differential capacitance sensors may be formed with any suitable electrode architecture, such as architectures similar to those described above with the addition of a third electrode 327. In an embodiment, the three electrodes 321, 322, and 327 may also be surrounded by a guard ring (not shown) to improve signal integrity.

In FIGS. 3A-3F, the sensors 312 are all shown with a single capacitor structure (or a single differential capacitor structure in FIG. 3F) on the substrate 320. However, it is to be appreciated that embodiments may include any number of capacitor structures disposed over the substrate 320. For example, two or more capacitors (or two or more differential capacitors) may be disposed over the substrate 320.

Figure 4A:
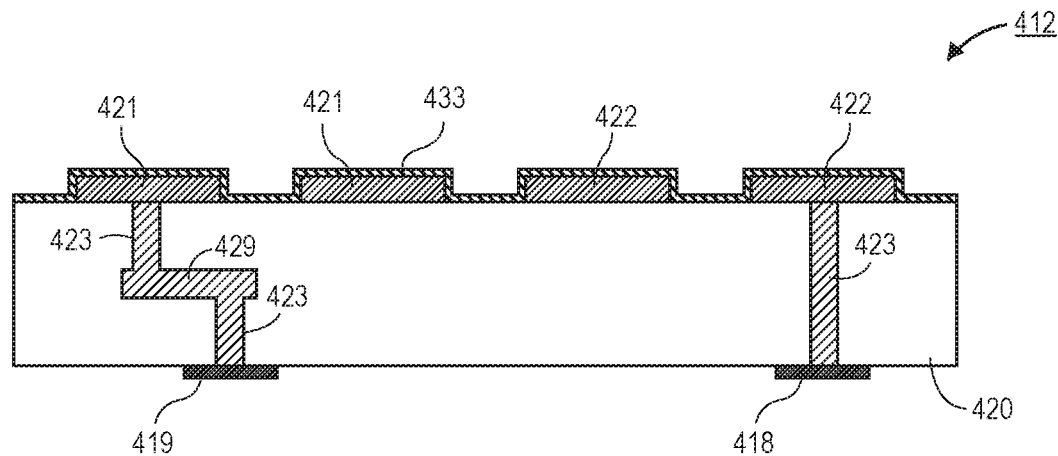
FIG. 4A is a cross-sectional illustration of a capacitive sensor on a substrate, in accordance with an embodiment.

Referring now to FIG. 4A, a cross-sectional illustration of a sensor 412 is shown, in accordance with an embodiment. In an embodiment, the sensor 412 comprises a substrate 420 with a first electrode 421 and a second electrode 422 disposed over the substrate 420. In FIG. 4A, there appears to be two distinct first electrodes 421 and two distinct second electrodes 422. However, it is to be appreciated that the first electrodes 421 may be connected together out of the plane of FIG. 4A, and the second electrodes 422 may be connected together out of the plane of FIG. 4A.

In an embodiment, the first electrode 421 and the second electrode 422 may be conductive materials that are compatible with microelectronic processing operations. For example, the material for the first electrode 421 and the second electrode 422 may comprise, but is not limited to, aluminum, molybdenum, tungsten, titanium, nickel, chromium, and alloys thereof.

In an embodiment, the first electrode 421 is electrically coupled to a first pad 419 on the backside of the substrate 420 by a conductive path through the substrate 420. For example, the conductive path may comprise one or more vias 423, traces 429, and the like. In an embodiment, the second electrode 422 is electrically coupled to a second pad 418 on the backside of the substrate 420 by a conductive path through the substrate 420. The conductive path coupling the second electrode 422 to the second pad 418 is shown as a single via 423, but it is to be appreciated that additional routing along the conductive path may occur in some embodiments. In an embodiment, the conductive paths (e.g., traces 429 and vias 423) embedded in the substrate 420 may comprise conductive materials, such as, but not limited to, tungsten, molybdenum, titanium, tantalum, alloys thereof, and the like. In an embodiment, the first pad 419 and the second pad 418 may comprise materials, such as, but not limited to titanium, nickel, palladium, copper, and the like. In some embodiments, the first pad 419 and the second pad 418 may be multi-layer stacks to improve integration with the CDC (not shown). For example, the first pad 419 and the second pad 418 may comprise stacks such as titanium/nickel/palladium, titanium/copper/palladium, or other material stacks commonly used for interconnect pads.

In an embodiment, the first electrode 421, the second electrode 422, and a top surface of the substrate 420 may be covered by a layer 433. In a particular embodiment, the layer 433 may be a conformal layer. That is, a thickness of the layer 433 over top surfaces of the first electrode 421 and the second electrode 422 may be substantially similar to a thickness of the layer over sidewall surfaces of the first electrode 421 and the second electrode 422. Layer 433 may be a barrier layer that protects the sensor 412 during processing within a chamber. A more detailed description of the layer 433 is provided below with respect to FIGS. 5A-5D.

In an embodiment, the substrate 420 may have a form factor suitable for integration in various locations within a processing tool. The substrate may have a thickness that is approximately 1.0 mm or less. In some embodiments, the thickness of the substrate 420 may be between approximately 0.50 mm and approximately 0.75 mm.

In an embodiment, the substrate 420 may be any suitable substrate material that is resistant to processing conditions within the processing chamber (e.g., etching conditions). However, it is to be appreciated that in some embodiments, the layer 433 provides additional protection to the substrate 420, and therefore, may not need to be resistant to all processing conditions in some embodiments. The substrate 420 may be a ceramic material, a glass, or other insulating materials. In some embodiments, the substrate 420 may be a flexible substrate, such as a polymeric material. A more detailed description of possible substrate configurations are provided below with respect to FIGS. 6A-6C.

Figure 4B:
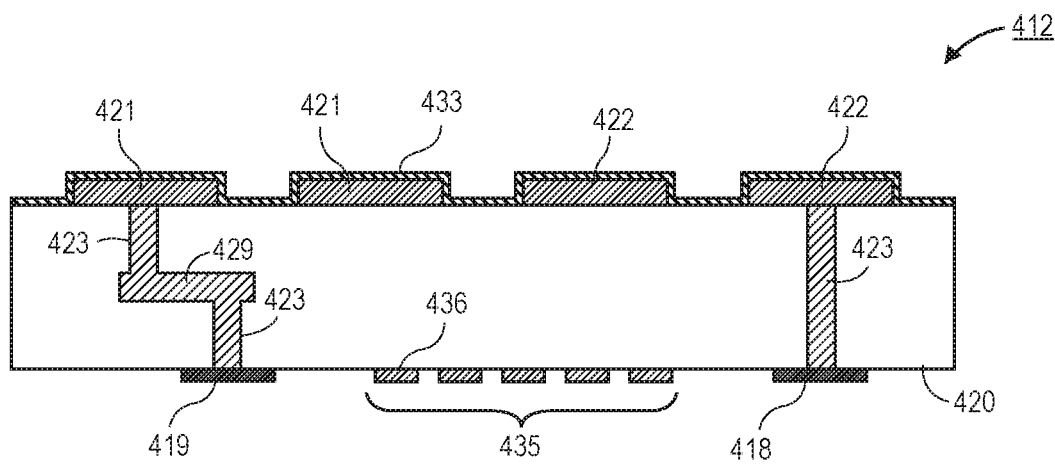
FIG. 4B is a cross-sectional illustration of a capacitive sensor on a substrate that further comprises a temperature sensor, in accordance with an embodiment.

Referring now to FIG. 4B, a cross-sectional illustration of a sensor 412 is shown, in accordance with an additional embodiment. In an embodiment, the sensor 412 in FIG. 4B is substantially similar to the sensor 412 in FIG. 4A, with the exception that a thermal sensor 435 is disposed on the substrate 420. For example, the thermal sensor 435 may be formed over a backside surface of the substrate 420 (i.e., on the opposite surface from the first electrode 421 and the second electrode 422).

The thermal sensor 435 may comprise any suitable sensing technology. For example, the thermal sensor 435 in FIG. 4B is shown as comprising a plurality of traces 436 to form a resistive temperature detector (RTD). However, it is to be appreciated that other thermal sensors, such as, but not limited to, a thermocouple (TC) sensor or thermistor (TR) sensor may be used. In the illustrated embodiment, the thermal sensor 435 is integrated directly on the substrate 420. However, it is to be appreciated that in some embodiments, a discrete component including a thermal sensor 435 may be mounted to the substrate 420. In other embodiments, a thermal sensor 435 may be integrated into a CDC (not shown) that is attached to the sensor 412. Many dies already include thermal sensors to monitor the die temperature. For example, a PN junction may be used to monitor the temperature of the die. The internal thermal sensor of the die may therefore also be used to monitor external temperatures within the processing tool. In an additional embodiment, a fiber optical thermal sensor can be attached to the backside of substrate to monitor the temperature.

The inclusion of a thermal sensor 435 provides additional data to monitor the chamber condition with the sensor 412. For example, chamber wall temperatures may be monitored. In some embodiments, the thermal information obtained with the thermal sensor 435 is primarily used to detect a change in temperature of the sensor. In many instances, detecting a change in temperature provides sufficient information. As such, placing the thermal sensor 435 on the backside of the substrate 420 (i.e., so it is not directly exposed to the interior of the processing chamber) may provide sufficient data to monitor a desired chamber condition.

Figure 4C:
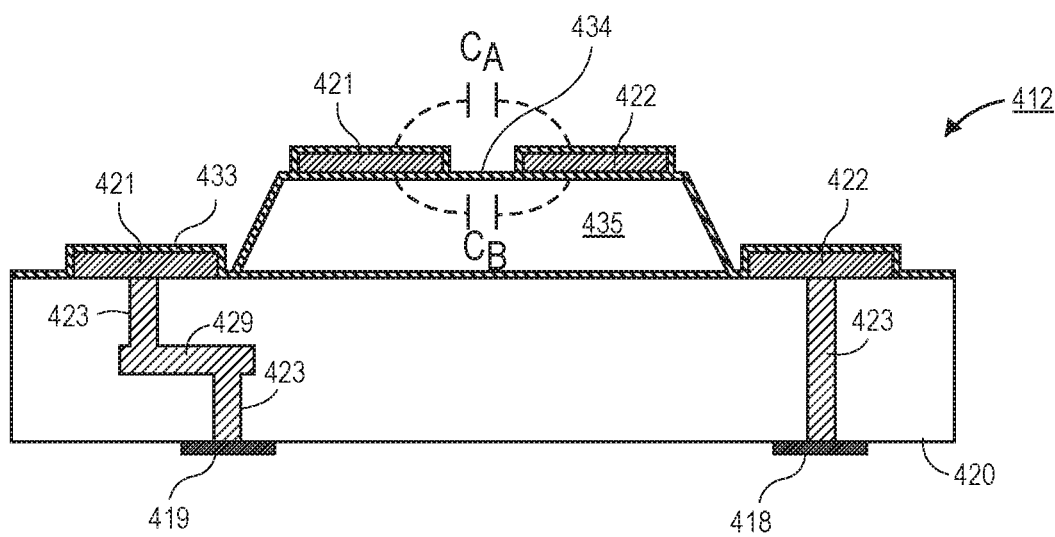
FIG. 4C is a cross-sectional illustration of a capacitive sensor on a substrate with electrodes supported above the substrate, in accordance with an embodiment.

Referring now to FIG. 4C, a cross-sectional illustration of a sensor 412 is shown, in accordance with an additional embodiment. The sensor 412 in FIG. 4C may comprise a support 434 that raises portions of the first electrode 421 and the second electrode 422 away from the front side surface of the substrate 420. In an embodiment, the support 434 may comprise the same material as the layer 433.

The support 434 defines a cavity 435 below portions of the first electrode 421 and the second electrode 422. The cavity 425 may have a dielectric constant that is lower than the dielectric constant of the substrate 420. In a particular embodiment, the cavity 435 is an air cavity. In other embodiments, a low-k dielectric constant material fills the cavity 435.

Providing a low-k cavity 435 below portions of the first electrode 421 and the second electrode 422 improves sensitivity of the sensor 412. This is because, the capacitance between the first electrode 421 and the second electrode 422 includes the electric field above the electrodes 421, 422 (illustrated as capacitance $C_A$) and the electric field below the electrodes 421, 422 (illustrated as capacitance $C_B$). Changes to the capacitance $C_A$ correspond to changes in the chamber, and it is expected that the capacitance $C_B$ will remain substantially constant (since the cavity 435 is protected by the support 434). As such, when the capacitance $C_B$ is low (as is the case when the cavity 435 is a low dielectric constant material or air), small changes to $C_A$ account for a larger proportion of the total capacitance of the sensor 412. In contrast, in embodiments without the support 434, the lower electric field (capacitance $C_B$) passes through the substrate 420, which has a higher dielectric constant. As such, the total capacitance of the sensor 412 is increased and small changes to the capacitance $C_A$ (which is used to monitor the chamber condition) account for a relatively smaller proportion of the total capacitance of the sensor 412.

Referring now to FIGS. 5A-5D, a series of cross-sectional illustrations depicting a portion of a first electrode 521 and the overlying layer 533 is shown, in accordance with an embodiment. In an embodiment, the overlying layer 533 is a material that is resistant to process chemistries and limits diffusion. First, as the protection layer, the overlayer 533 should protect the electrodes 521 during the processes. In the particular case of an etching chamber, a common etchant that is used is fluorine or chlorine. As such, the layer 533 used in such conditions should be resistant to chlorine or fluorine etchants in particular. Additionally, as the diffusion barrier, the layer 533 should prevent the diffusion of any plasma chemical species into the overlayer and into substrate. For example, the overlayer 533 should be resistant to fluorination. That is, resistant to the incorporation or diffusion of fluorine into the layer 533. This is because the addition of fluorine into the layer 533 may result in changes to the measured capacitance, and cause sensor drift.

In the particular embodiment of a plasma chamber used for etching, the layer 533 may comprise one or more of a metallic oxide, a metallic fluoride, and a metallic oxyfluoride. The layer 533 may comprise materials, such as, but not limited to, aluminum oxide, magnesium oxide, yttrium oxyfluoride, yttrium zirconium oxyfluoride, yttrium aluminum oxide, or hafnium oxide. While examples of material suitable for the layer 533 in an etching plasma chamber are provided, it is to be appreciated that materials used for the layer 533 may be optimized for various processing environments. For example, a plasma treatment chamber, a plasma assisted deposition chamber, or the like have different processing environments that may require different materials in order to minimize various design concerns, such as, but not limited to, damage to the sensor, cross-contamination, diffusion of various species, and the like.

Referring now to FIG. 5A, a cross-sectional illustration of one example of a layer 533 over a first electrode 521 is shown, in accordance with an embodiment. As shown, the layer 533 may be a single material layer. For example, the layer 533 may comprise any of the suitable materials listed above.

Referring now to FIG. 5B, a cross-sectional illustration of another example of a layer 533 is shown, in accordance with an embodiment. As shown, the layer 533 may comprise a multi-layer stack. Each of the layers in the stack may be optimized for different performance metrics. Instead of selecting a single material that may be sub-optimal in some performance metrics, separate materials may be chosen that are each optimal for different performance metrics. For example, a first layer $533_A$ may be a plasma resistant material, and the second layer $533_B$ may be a diffusion barrier layer. In a particular embodiment, the first layer $533_A$ may be YO(Zr:F), and the second layer $533_B$ may be $Al_2O_3$.

Referring now to FIG. 5C, a cross-sectional illustration of another example of the layer 533 is shown, in accordance with an embodiment. The layer 533 may include a third layer 533c. In some embodiments, the third layer 533c may be an adhesion layer, or it may provide any other needed material property to the multi-layer stack.

Referring now to FIG. 5D, a cross-sectional illustration of another example of the layer 533 is shown, in accordance with an embodiment. The multi-layer stack layer 533 comprises alternating first layers $533_A$ and second layers $533_B$. As such, additional protection is provided in order to extend the usable life of the sensor.

Referring now to FIGS. 6A-6C, a series of cross-sectional illustrations depicting various substrate 620 configurations are shown, in accordance with an embodiment. The substrates 620 may include any suitable material. For example, the substrate 620 may comprise materials, such as, but not limited to, silicon, silicon oxide, aluminum oxide, aluminum nitride, plastics, or other insulating materials. In order to allow for manufacture of a high volume of the sensors, the substrate 620 may be a material that is compatible with high volume manufacturing (HVM) processes. That is, the substrate 620 may be a material that is available in panel form, wafer form, or the like. A more detailed description of a method for fabricating the sensors is described in greater detail below with respect to FIGS. 8A-8I.

Referring now to FIG. 6A, a cross-sectional illustration of substrate 620 for use in a sensor is shown, in accordance with an embodiment. As shown, the substrate 620 is a monolithic structure. That is, a single layer of material is used to form the substrate 620. In such an embodiment, through substrate vias (not shown) may be formed through a thickness of the substrate 620 to provide electrical connections between the front side surface and the backside surface.

Referring now to FIG. 6B, a cross-sectional illustration of substrate 620 is shown, in accordance with an additional embodiment. As shown, the substrate 620 may comprise a plurality of layers 6201-$n$. While four layers are shown in FIG. 6B, it is to be appreciated that any number of layers may be used to form the substrate 620.

Referring now to FIG. 6C, a cross-sectional illustration of substrate 620 is shown, in accordance with an embodiment. As shown, the substrate 620 may comprise alternating first layers $620_A$ and second layers $620_B$. For example, the first layers $620_A$ may be silicon and the second layers $620_B$ may be insulating layers, such as, but not limited to, aluminum oxide, aluminum nitride, silicon oxide, silicon nitride, or other thin dielectrics.

Figure 7A:
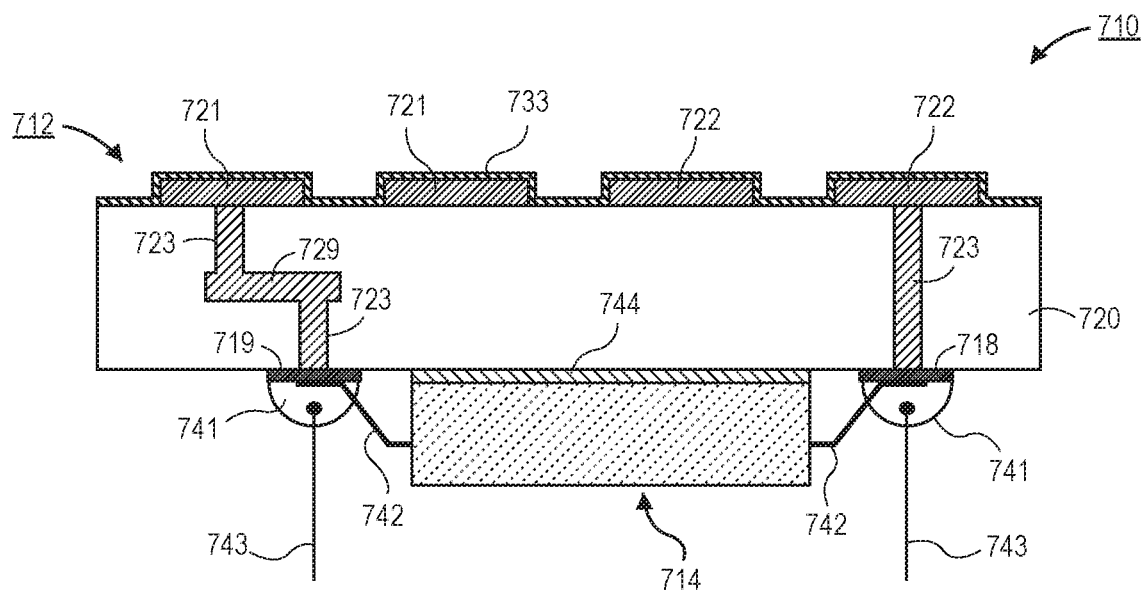
FIG. 7A is a cross-sectional illustration of a sensor module with a capacitive-to-digital converter (CDC) attached to the substrate, in accordance with an embodiment.

Referring now to FIG. 7A, a cross-sectional illustration of a sensor module 710 is shown, in accordance with an embodiment. In an embodiment, the sensor module 710 comprises a sensor 712 and a CDC 714. In an embodiment, the sensor 712 may be any sensor in accordance with embodiments described herein. For example, the sensor 712 may comprise a substrate 720, a first electrode 721 over the substrate 720, and a second electrode 722 over the substrate 720. The first electrode 721 may be electrically coupled to a first pad 719 on the opposite surface of the substrate 720 by a conductive path (e.g., including traces 729 and vias 723). The second electrode 722 may be electrically coupled to a second pad 718 on the opposite surface of the substrate 720 by a conductive path (e.g., including a via 723). In an embodiment, a layer 733 may be disposed over surfaces of the first electrode 721, the second electrode 722, and the substrate 720.

In an embodiment, the CDC 714 is attached to the backside surface of the substrate 720 (i.e., opposite from the electrodes 721, 722) by an adhesive 744 or the like. The CDC 714 is electrically coupled to the first pad 719 and the second pad 718 by interconnects 742. For example, the interconnects 742 may be wire bonds or the like. In an embodiment, the interconnects 742 are coupled to the first pad 719 and the second pad 741 by a solder 741. The use of a solder 741 to attach the interconnects 742 to the pads 718, 719 may be practical when the sensor module 710 is utilized in low temperature environments (e.g., less than 200° C.). In some embodiments, the CDC 714 may be secured to the substrate 720 only by the solder 741. That is, the adhesive 744 may be omitted. The CDC 714 may be implemented as an ASIC die. In some embodiments, a PN junction within the CDC 714 may be used by the sensor module 710 for temperature monitoring. In other embodiments, a temperature sensor (not shown) may be disposed on the substrate 720. In an additional embodiment, the CDC 714 may be coupled to the pads 718, 719 using flip-chip bonding. That is, solder bumps may replace wire bond interconnects 742.

Figure 7B:
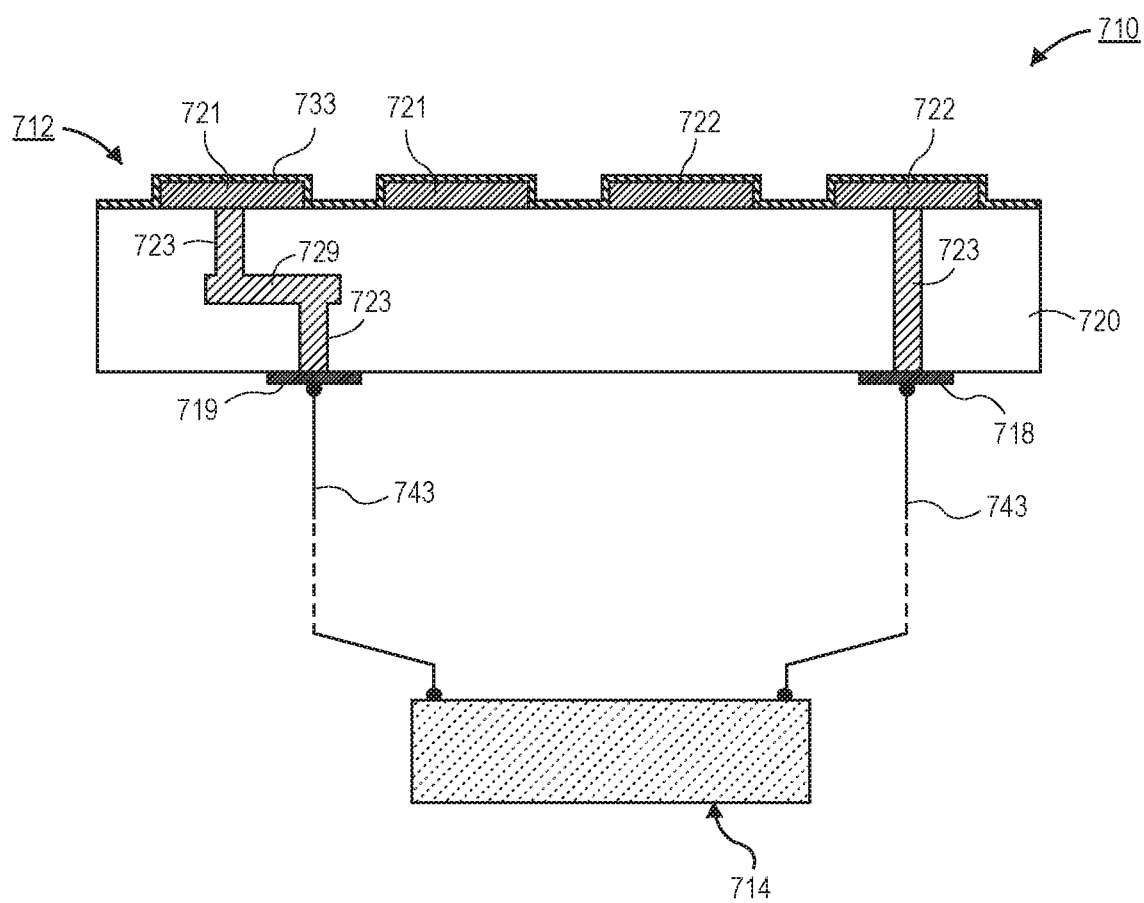
FIG. 7B is a cross-sectional illustration of a sensor module with a CDC connected to the substrate by wires or pins, in accordance with an embodiment.

Referring now to FIG. 7B, a cross-sectional illustration of a sensor module 710 is shown, in accordance with an additional embodiment. In an embodiment, the sensor module 710 in FIG. 7B may be similar to the sensor module 710 in FIG. 7A, with the exception that the CDC 714 is remote from the substrate 720. For example, the CDC 714 may be electrically coupled to the first pad 719 and the second pad 718 by interconnects 743. In an embodiment, the interconnects may be wire bonds or pins. The interconnects may be secured to the pads 719, 718 by springs or poker pins. Accordingly, the interconnects 743 may be secured without the use of a solder. Since no solder is used and the CDC 714 is remote from the sensor 712, the operating temperature of the sensor module 710 may be increased. For example, the operating temperature may be approximately 400° C. or greater.

Referring now to FIGS. 8A-8I, a series of illustrations depict a process for fabricating a sensor 812 in accordance with an embodiment. The processing operations disclosed in FIGS. 8A-8I allow for high volume manufacturing (HVM) of the sensors 812. Accordingly, the cost of individual sensors 812 can be minimized.

Figure 8A:
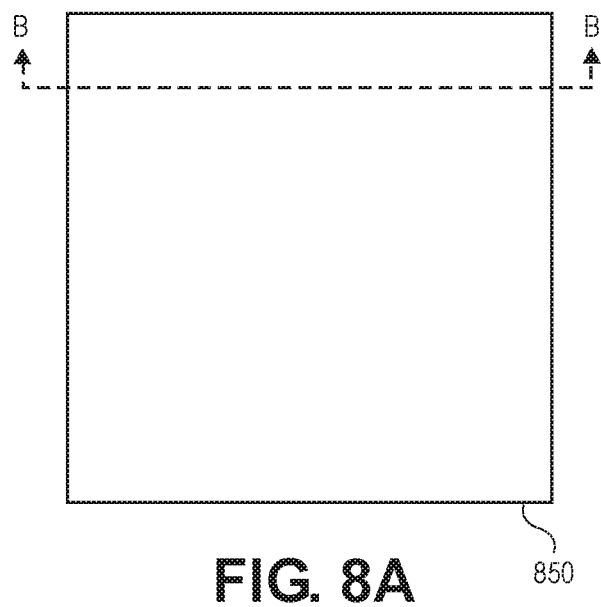
FIGS. 8A-8F are plan view illustrations and cross-sectional illustrations depicting a process for forming a capacitive sensor on a substrate, in accordance with an embodiment.
Figure 8B:
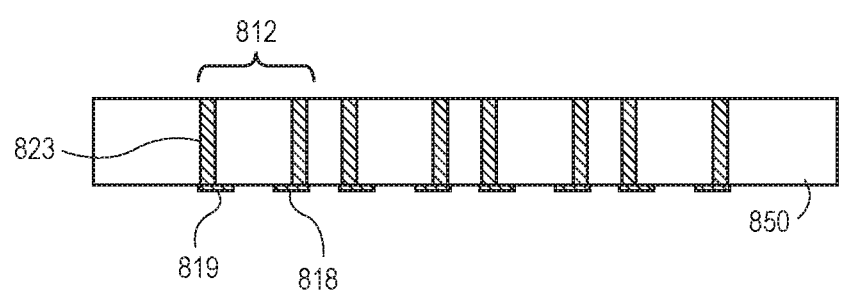

Referring now to FIG. 8A and FIG. 8B, a plan view illustration and a corresponding cross-sectional illustration along line B-B' of a substrate panel 850 are shown, respectively, in accordance with an embodiment. In an embodiment, the substrate panel 850 may be any suitable size. The substrate panel 850 may also include any suitable substrate, such as those described above. While the substrate panel 850 is shown as having a single monolithic structure, it is to be appreciated that the substrate panel 850 may comprise a plurality of layers (e.g., similar to the embodiments described with respect to FIGS. 6A-6C above). In an embodiment, electrical features of a plurality of sensor regions 812 are patterned into the substrate panel 850. For example, each sensor region 812 may comprise a pair of vias 723, a first pad 819, and a second pad 818. In some embodiments traces (not shown) may also be embedded within the substrate panel 850 to provide lateral routing for each sensor region 812.

Figure 8C:
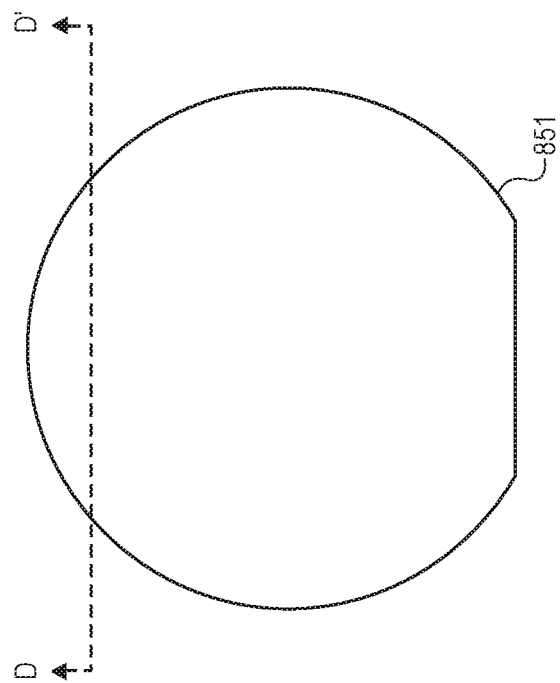
Figure 8D:
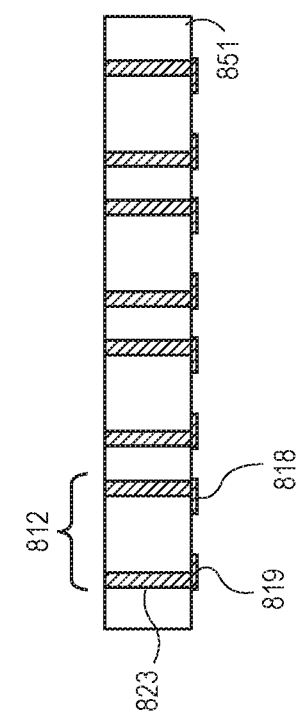

Referring now to FIG. 8C and FIG. 8D, a plan view illustration and a corresponding cross-sectional illustration along line D-D' after the substrate panel 850 is reformatted into a wafer substrate 851 are shown, respectively. In an embodiment, the reformatting may be implemented with a laser patterning process. Reformatting to a wafer substrate 851 may allow for compatibility with processing tools used in subsequent processing operations to form the sensor electrodes and passivation layer.

In some embodiments, the reformatting operation may be omitted. That is, the electrodes of each sensor region 812 may be fabricated on the substrate panel 850. In other embodiments, the fabrication of the sensors 812 may begin at the wafer substrate 851 form factor. For example, silicon substrates are typically already available in the wafer form factor.

Figure 8E:
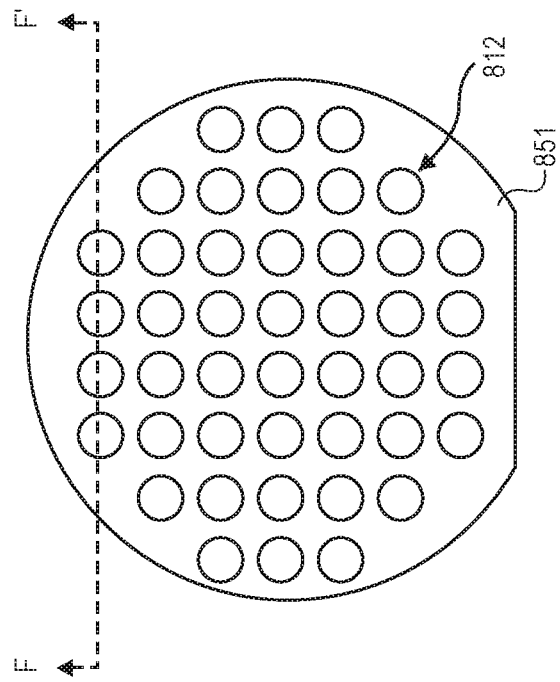
Figure 8F:
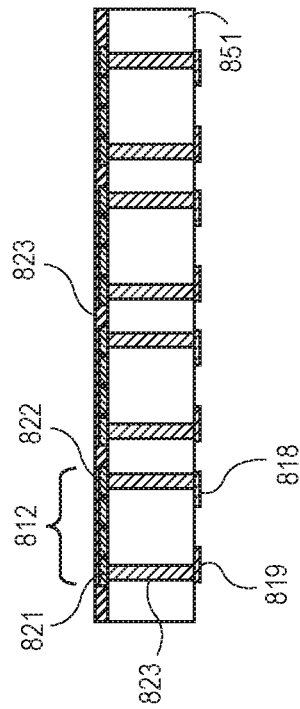

Referring now to FIGS. 8E and 8F, a plan view illustration and a corresponding cross-sectional illustration along line F-F' after electrodes 821, 822 and a passivation layer 833 are disposed on the wafer substrate 851 are shown, respectively, in accordance with an embodiment. In an embodiment, each sensor region 812 may comprise a first electrode 821 and a second electrode 822. The first electrode 821 may be electrically coupled to a first pad 819, and the second electrode 822 may be electrically coupled to a second pad 818. In an embodiment, the first electrode 821 and the second electrode 822 may be fabricated in any suitable pattern, such as, but not limited to, the patterns described above with respect to FIGS. 3A-3F.

In an embodiment, the first electrode 821 and the second electrode 822 may be fabricated with any suitable processes. For example, a blanket layer of the material for the first electrode 821 and the second electrode 822 may be disposed over a top surface of the wafer substrate 851. The blanket layer may then be patterned using a lithographic patterning process followed by etch (plasma dry etch or wet chemical etch).

In an embodiment, the passivation layer 833 may be disposed over the first electrode 821, the second electrode 822, and the top surface of the wafer substrate 851 using any suitable deposition process. In a particular embodiment, the passivation layer 833 may be disposed with a conformal deposition process. For example, the deposition process may include, but is not limited to, an atomic layer deposition (ALD), chemical vapor deposition (CVD), physical vapor deposition (PVD), spray pyrolysis, and the like. In an embodiment, the passivation layer 833 may include one or more layers in order to provide a desired resistance to processing conditions and/or to minimize diffusion. For example, passivation layers 833, such as, but not limited to, those described above with respect to FIGS. 5A-5D may be disposed over the first electrode 821, the second electrode 822, and the top surface of the wafer substrate 851.

Figure 8G:
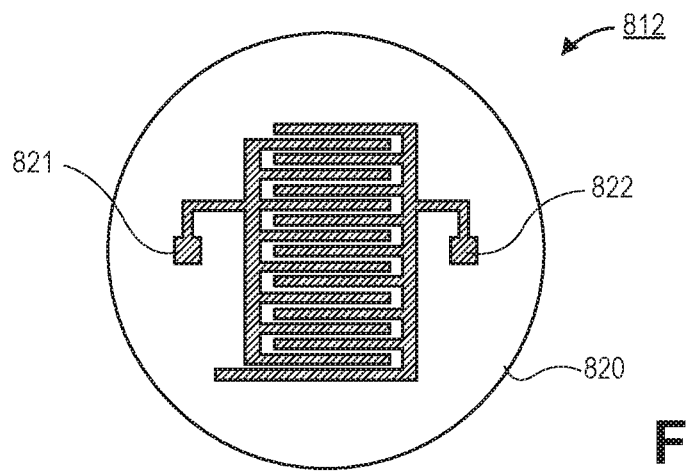
FIGS. 8G-8I are plan view illustrations of capacitive sensors, in accordance with various embodiments.

Referring now to FIG. 8G, a plan view illustration of an individual sensor 812 is shown, in accordance with an embodiment. The plurality of sensor regions 812 in the wafer substrate 851 may be singulated to form the individual sensors 812. For example, a laser process may be used to singulate the sensors 812 with a substrate 820 having any shape. For example, in FIG. 8G, the sensor 812 is shown as having a substantially circular shape.

Figure 8H:
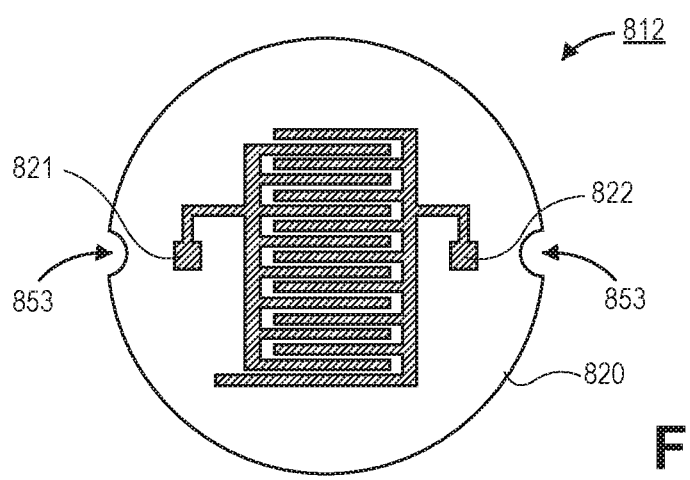

Referring now to FIG. 8H, a plan view illustration of an individual sensor 812 is shown, in accordance with an additional embodiment. The substrate 820 of the sensor 812 may have a substantially circular shape that further includes one or more notches 853. The notches 853 may be used to align the sensor 812 to a housing (not shown).

Figure 8I:
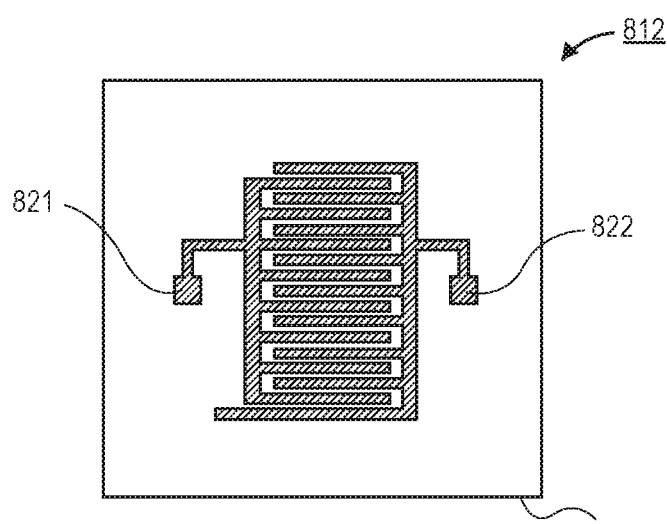

Referring now to FIG. 8I, a plan view illustration of an individual sensor 812 is shown, in accordance with an additional embodiment. The substrate 820 of the sensor 812 may have a substantially square shape. However, it is to be appreciated that other shaped substrates 820 may also be singulated from the wafer substrate 851. For example, the substrate 820 of an individual sensor 812 may have a shape such as, but not limited to, rectangular, other polygonal shapes, elliptical, circular, or any other shape, with different shapes of notches or holes for the purpose of mechanical engagement to sensor housing for the sensor module packaging.

Providing capacitive sensor modules, such as those described herein, within a processing apparatus allows for chamber conditions to be monitored during the execution of various processing recipes, during transitions between substrates, during cleaning operations (e.g., ICC operations), during chamber validation, or during any other desired time. Furthermore, the architecture of the sensor modules disclosed herein allows for integration in many different locations. Such flexibility allows for many different components of a processing apparatus to be monitored simultaneously in order to provide enhanced abilities to determine the cause of process drift. For example, FIG. 9 provides a schematic of a processing apparatus 900 that includes the integration of capacitive sensor modules 911 in various locations.

Figure 9:
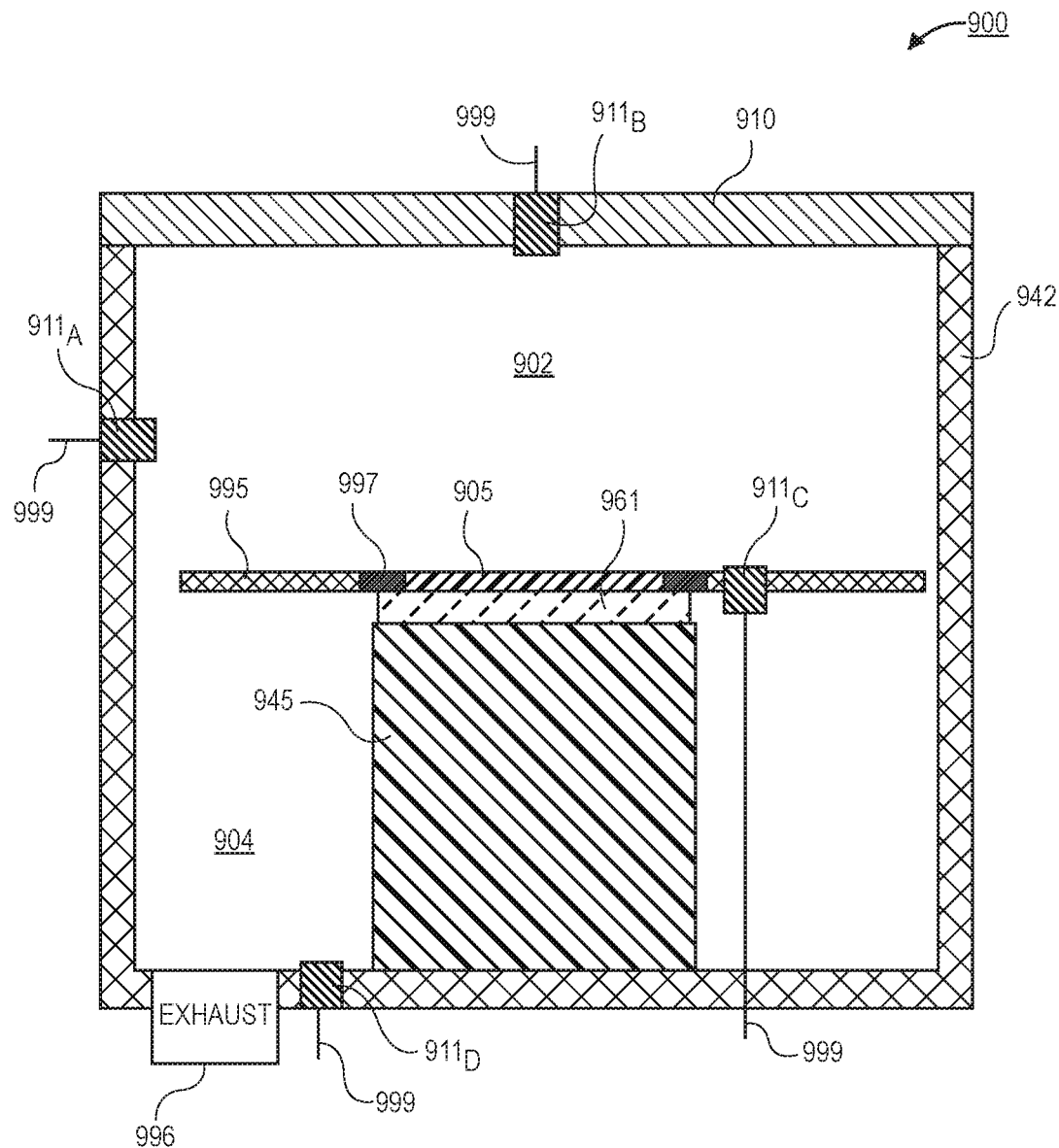
FIG. 9 is a schematic illustration of a processing tool that illustrates exemplary locations where sensor modules may be located, in accordance with an embodiment.

As shown, in FIG. 9, the processing apparatus 900 may comprise a chamber 942. A cathode liner 945 may surround a lower electrode 961. A substrate 905 may be secured to the lower electrode 961. A process ring 997 may surround the substrate 905, and a plasma screen 995 may surround the process ring 997. In an embodiment, a lid assembly 910 may seal the chamber 942. The chamber 942 may include a processing region 902 and an evacuation region 904. The evacuation region 904 may be proximate to an exhaust port 996.

In some embodiments, a sidewall sensor module $911_A$ may be located along a sidewall of the chamber 942. In some embodiments, the sidewall sensor module $911_A$ passes through the wall of the chamber 942 and is exposed to the processing region 902. In some embodiments, a lid sensor module $911_B$ is integrated with the lid assembly 910 and faces the processing region 902. In some embodiments, a process ring sensor module $911_C$ is positioned adjacent to the process ring 997. For example, the process ring sensor module $911_C$ may be integrated with the plasma screen 995 that surrounds the process ring 997. In yet another embodiment, an evacuation region sensor module $911_D$ may be located in the evacuation region 904. For example, the evacuation region sensor module $911_D$ may pass through a bottom surface of the chamber 942. As shown, each of the sensor modules 911 includes an electrical lead 999 that exits the chamber 942. As such, real time monitoring with the sensor modules 911 may be implemented.

Figure 10A:
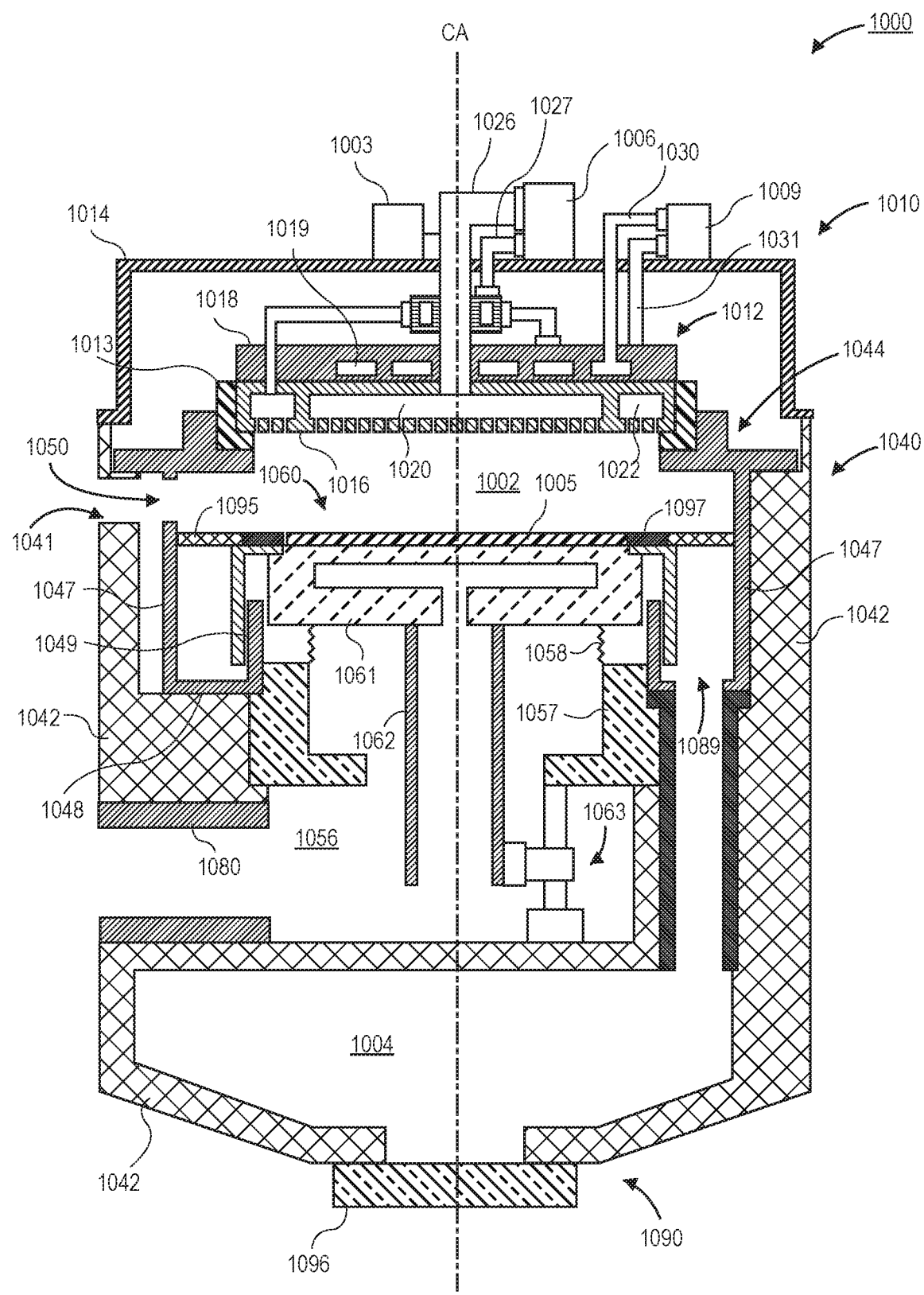
FIG. 10A is a cross-sectional illustration of a processing tool that may comprises one or more sensor modules, in accordance with an embodiment.

FIG. 10A is a schematic, cross-sectional view of a plasma processing apparatus 1000 that comprises one or more sensor modules, such as those described herein according to an embodiment. The plasma processing apparatus 1000 may be a plasma etch chamber, a plasma enhanced chemical vapor deposition chamber, a physical vapor deposition chamber, a plasma treatment chamber, an ion implantation chamber, or other suitable vacuum processing chamber. As shown in FIG. 10A, the plasma processing apparatus 1000 generally includes a chamber lid assembly 1010, a chamber body assembly 1040, and an exhaust assembly 1090, which collectively enclose a processing region 1002 and an evacuation region 1004. In practice, processing gases are introduced into the processing region 1002 and ignited into a plasma using RF power. A substrate 1005 is positioned on a substrate support assembly 1060 and exposed to the plasma generated in the processing region 1002 to perform a plasma process on the substrate 1005, such as etching, chemical vapor deposition, physical vapor deposition, implantation, plasma annealing, plasma treating, abatement, or other plasma processes. Vacuum is maintained in the processing region 1002 by the exhaust assembly 1090, which removes spent processing gases and byproducts from the plasma process through the evacuation region 1004.

The lid assembly 1010 generally includes an upper electrode 1012 (or anode) isolated from and supported by the chamber body assembly 1040 and a chamber lid 1014 enclosing the upper electrode 1012. The upper electrode 1012 is coupled to an RF power source 1003 via a conductive gas inlet tube 1026. The conductive gas inlet tube 1026 is coaxial with a central axis of the chamber body assembly 1040 so that both RF power and processing gases are symmetrically provided. The upper electrode 1012 includes a showerhead plate 1016 attached to a heat transfer plate 1018. The showerhead plate 1016, the heat transfer plate 1018, and the gas inlet tube 1026 are all fabricated from an RF conductive material, such as aluminum or stainless steel.

The showerhead plate 1016 has a central manifold 1020 and one or more outer manifolds 1022 for distributing processing gasses into the processing region 1002. The one or more outer manifolds 1022 circumscribe the central manifold 1020. The central manifold 1020 receives processing gases from a gas source 1006 through the gas inlet tube 1026, and the outer manifold(s) 1022 receives processing gases, which may be the same or a different mixture of gases received in the central manifold 1020, from the gas source 1006 through gas inlet tube(s) 1027. The dual manifold configuration of the showerhead plate 1016 allows improved control of the delivery of gases into the processing region

1002. The multi-manifold showerhead plate 1016 enables enhanced center to edge control of processing results as opposed to conventional single manifold versions.

A heat transfer fluid is delivered from a fluid source 1009 to the heat transfer plate 1018 through a fluid inlet tube 1030. The fluid is circulated through one or more fluid channels 1019 disposed in the heat transfer plate 1018 and returned to the fluid source 1009 via a fluid outlet tube 1031. Suitable heat transfer fluids include water, water-based ethylene glycol mixtures, a perfluoropolyether (e.g., Galden® fluid), oil-based thermal transfer fluids, or similar fluids.

The chamber body assembly 1040 includes a chamber body 1042 fabricated from a conductive material resistant to processing environments, such as aluminum or stainless steel. The substrate support assembly 1060 is centrally disposed within the chamber body 1042 and positioned to support the substrate 1005 in the processing region 1002 symmetrically about the central axis (CA). The substrate support assembly 1060 may also support a process ring 1097 that surrounds the substrate 1005. The chamber body 1042 includes a ledge that supports an outer flange of an upper liner assembly 1044. The upper liner assembly 1044 may be constructed from a conductive, process compatible material, such as aluminum, stainless steel, and/or yttria (e.g., yttria coated aluminum). In practice, the upper liner assembly 1044 shields the upper portion of the chamber body 1042 from the plasma in the processing region 1002 and is removable to allow periodic cleaning and maintenance. An inner flange of the upper liner assembly 1044 supports the upper electrode 1012. An insulator 1013 is positioned between the upper liner assembly 1044 and the upper electrode 1012 to provide electrical insulation between the chamber body assembly 1040 and the upper electrode 1012.

The upper liner assembly 1044 includes an outer wall 1047 attached to the inner and outer flanges, a bottom wall 1048, and an inner wall 1049. The outer wall 1047 and inner wall 1049 are substantially vertical, cylindrical walls. The outer wall 1047 is positioned to shield chamber body 1042 from plasma in the processing region 1002, and the inner wall 1049 is positioned to at least partially shield the side of the substrate support assembly 1060 from plasma in the processing region 1002. The bottom wall 1048 joins the inner and outer walls (1049, 1047) except in certain regions where evacuation passages 1089 are formed.

The processing region 1002 is accessed through a slit valve tunnel 1041 disposed in the chamber body 1042 that allows entry and removal of the substrate 1005 into/from the substrate support assembly 1060. The upper liner assembly 1044 has a slot 1050 disposed there through that matches the slit valve tunnel 1041 to allow passage of the substrate 1005 there through. A door assembly (not shown) closes the slit valve tunnel 1041 and the slot 1050 during operation of the plasma processing apparatus.

The substrate support assembly 1060 generally includes lower electrode 1061 (or cathode) and a hollow pedestal 1062, the center of which the central axis (CA) passes through, and is supported by a central support member 1057 disposed in the central region 1056 and supported by the chamber body 1042. The central axis (CA) also passes through the center of the central support member 1057. The lower electrode 1061 is coupled to the RF power source 1003 through a matching network (not shown) and a cable (not shown) routed through the hollow pedestal 1062. When RF power is supplied to the upper electrode 1012 and the lower electrode 1061, an electrical field formed there between ignites the processing gases present in the processing region 1002 into a plasma.

The central support member 1057 is sealed to the chamber body 1042, such as by fasteners and O-rings (not shown), and the lower electrode 1061 is sealed to the central support member 1057, such as by a bellows 1058. Thus, the central region 1056 is sealed from the processing region 1002 and may be maintained at atmospheric pressure, while the processing region 1002 is maintained at vacuum conditions.

An actuation assembly 1063 is positioned within the central region 1056 and attached to the chamber body 1042 and/or the central support member 1057. The actuation assembly 1063 provides vertical movement of the lower electrode 1061 relative to the chamber body 1042, the central support member 1057, and the upper electrode 1012. Such vertical movement of the lower electrode 1061 within the processing region 1002 provides a variable gap between the lower electrode 1061 and the upper electrode 1012, which allows increased control of the electric field formed there between, in turn, providing greater control of the density in the plasma formed in the processing region 1002. In addition, since the substrate 1005 is supported by the lower electrode 1061, the gap between the substrate 1005 and the showerhead plate 1016 may also be varied, resulting in greater control of the process gas distribution across the substrate 1005.

In one embodiment, the lower electrode 1061 is an electrostatic chuck, and thus includes one or more electrodes (not shown) disposed therein. A voltage source (not shown) biases the one or more electrodes with respect to the substrate 1005 to create an attraction force to hold the substrate 1005 in position during processing. Cabling coupling the one or more electrodes to the voltage source is routed through the hollow pedestal 1062 and out of the chamber body 1042 through one of the plurality of access tubes 1080.

Figure 10B:
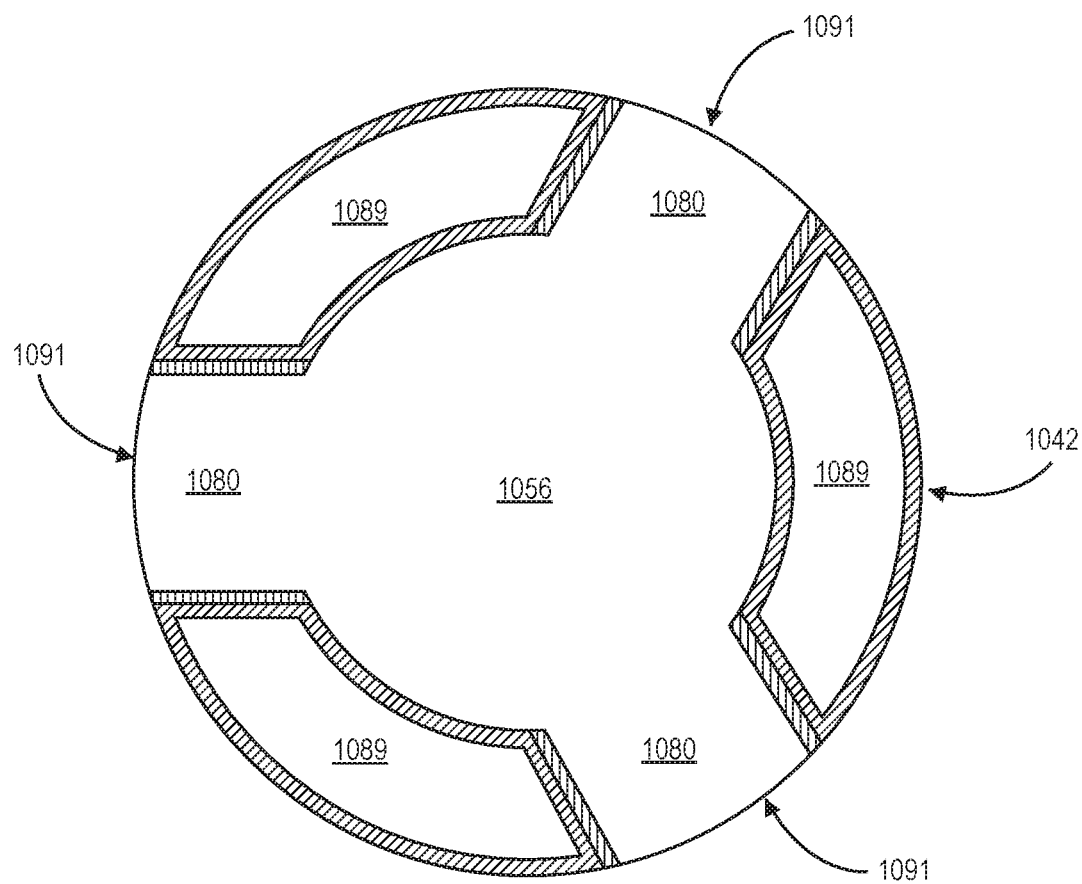
FIG. 10B is a cross-sectional illustration of the processing tool in FIG. 10A that depicts the symmetric layout of access tubes and evacuation passages, in accordance with an embodiment.

FIG. 10B is a schematic depiction of the layout of the access tubes 1080 within spokes 1091 of the chamber body assembly 1040. The spokes 1091 and access tubes 1080 are symmetrically arranged about the central axis (CA) of the processing apparatus 1000 in a spoke pattern as shown. In the embodiment shown, three identical access tubes 1080 are disposed through the chamber body 1042 into the central region 1056 to facilitate supply of a plurality of tubing and cabling from outside of the chamber body 1042 to the lower electrode 1061. Each of the spokes 1091 are adjacent to an evacuation passage 1089 that fluidically couples the processing region 1002 above the central region 1056 to the evacuation region 1004 below the central region 1056. The symmetrical arrangement of the access tubes 1080 further provides electrical and thermal symmetry in the chamber body 1042, and particularly in the processing region 1002, in order to allow greater more uniform plasma formation in the processing region 1002 and improved control of the plasma density over the surface of the substrate 1005 during processing.

Similarly, the evacuation passages 1089 are positioned in the upper liner assembly 1044 symmetrically about the central axis (CA). The evacuation passages 1089 allow evacuation of gases from the processing region 1002 through the evacuation region 1004 and out of the chamber body 1042 through an exhaust port 1096. The exhaust port 1096 is centered about the central axis (CA) of the chamber body assembly 1040 such that the gases are evenly drawn through the evacuation passages 1089.

Referring again to FIG. 10A, a conductive, mesh liner 1095 is positioned on the upper liner assembly 1044. The mesh liner 1095 may be constructed from a conductive, process compatible material, such as aluminum, stainless steel, and/or yttria (e.g., yttria coated aluminum). The mesh liner 1095 may have a plurality of apertures (not shown) formed there through. The apertures may be positioned symmetrically about a center axis of the mesh liner 1095 to allow exhaust gases to be drawn uniformly there through, which in turn, facilitates uniform plasma formation in the processing region 1002 and allows greater control of the plasma density and gas flow in the processing region 1002. In one embodiment, the central axis of the mesh liner 1095 is aligned with the central axis (CA) of the chamber body assembly 1040.

The mesh liner 1095 may be electrically coupled to the upper liner assembly 1044. When an RF plasma is present within the processing region 1002, the RF current seeking a return path to ground may travel along the surface of the mesh liner 1095 to the outer wall 1047 of the upper liner assembly 1044. Thus, the annularly symmetric configuration of the mesh liner 1095 provides a symmetric RF return to ground and bypasses any geometric asymmetries of the upper liner assembly 1044.

In an embodiment, the one or more sensor modules may be located at various locations throughout the processing apparatus 1000. For example, a sensor module (or a portion of the sensor module) may be located in one or more locations, such as, but not limited to, along a sidewall of the chamber 1042, in the evacuation region 1004, adjacent to the process ring 1097 (e.g., integrated into the mesh liner 1095), or integrated with the lid assembly 1010. Accordingly, detection of various chamber conditions in multiple locations through the processing apparatus 1000 may be determined. The chamber conditions supplied by the one or more sensor modules may be used to modify one or more parameters, such as, for example, processing recipe parameters, cleaning schedules for the processing apparatus 1000, component replacement determinations, and the like.

While the processing apparatus 100 in FIGS. 10A and 10B provides a specific example of a tool that may benefit from the inclusion of sensor modules such as those disclosed herein, it is to be appreciated that embodiments are not limited to the particular construction of FIGS. 10A and 10B. That is, many different plasma chamber constructions, such as, but not limited to those used in the microelectronic fabrication industry, may also benefit from the integration of sensor modules, such as those disclosed herein.

Figure 11:
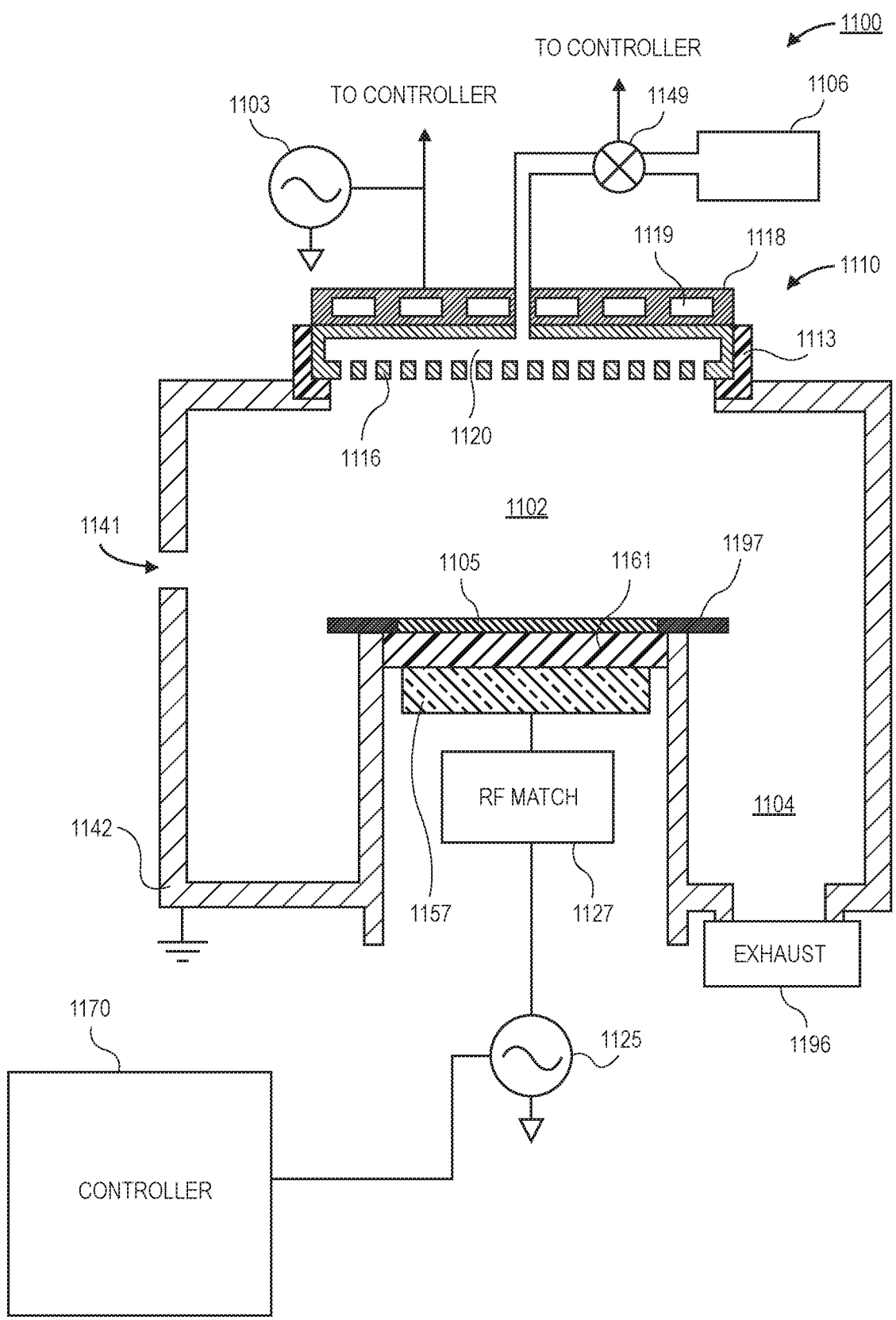
FIG. 11 is a cross-sectional illustration of a processing too that may comprise one or more sensor modules, in accordance with an embodiment.

For example, FIG. 11 is a cross-sectional illustration of a processing apparatus 1100 that can include one or more capacitive sensor modules such as those described above, in accordance with an embodiment. The plasma processing apparatus 100 may be a plasma etch chamber, a plasma enhanced chemical vapor deposition chamber, a physical vapor deposition chamber, a plasma treatment chamber, an ion implantation chamber, or other suitable vacuum processing chamber.

Processing apparatus 1100 includes a grounded chamber 1142. In some instances, the chamber 1142 may also comprise a liner (not shown) to protect the interior surfaces of the chamber 1142. The chamber 1142 may comprise a processing region 1102 and an evacuation region 1104. The chamber 1142 may be sealed with a lid assembly 1110. Process gases are supplied from one or more gas sources 1106 through a mass flow controller 1149 to the lid assembly 1110 and into the chamber 1105. An exhaust port 1196 proximate to the evacuation region 1104 may maintain a desired pressure within the chamber 1142 and remove byproducts from processing in the chamber 1142.

The lid assembly 1110 generally includes an upper electrode comprising a showerhead plate 1116 and a heat transfer plate 1118. The lid assembly 1110 is isolated from the chamber 1142 by an insulating layer 1113. The upper electrode is coupled to a source RF generator 1103 through a match (not shown). Source RF generator 1103 may have a frequency between 100 and 180 MHz, for example, and in a particular embodiment, is in the 162 MHz band. The gas from the gas source 1106 enters into a manifold 1120 within the showerhead plate 1116 and exits into processing region 1102 of the chamber 1142 through openings into the showerhead plate 1116. In an embodiment, the heat transfer plate 1118 comprises channels 1119 through which heat transfer fluid is flown. The showerhead plate 1116 and the heat transfer plate 1118 are fabricated from an RF conductive material, such as aluminum or stainless steel. In certain embodiments, a gas nozzle or other suitable gas distribution assembly is provided for distribution of process gases into the chamber 1142 instead of (or in addition to) the showerhead plate 1116.

The processing region 1102 may comprise a lower electrode 1161 onto which a substrate 1105 is secured. Portions of a process ring 1197 that surrounds the substrate 1105 may also be supported by the lower electrode 1161. The substrate 1105 may be inserted into (or extracted from) the chamber 1142 through a slit valve tunnel 1141 through the chamber 1142. A door for the slit valve tunnel 1141 is omitted for simplicity. The lower electrode 1161 may be an electrostatic chuck. The lower electrode 1161 may be supported by a support member 1157. In an embodiment, lower electrode 1161 may include a plurality of heating zones, each zone independently controllable to a temperature set point. For example, lower electrode 1161 may comprise a first thermal zone proximate a center of substrate 1105 and a second thermal zone proximate to a periphery of substrate 1105. Bias power RF generator 1125 is coupled to the lower electrode 1161 through a match 1127. Bias power RF generator 1125 provides bias power, if desired, to energize the plasma. Bias power RF generator 1125 may have a low frequency between about 2 MHz to 60 MHz for example, and in a particular embodiment, is in the 13.56 MHz band.

In an embodiment, the one or more sensor modules may be located at various locations throughout the processing apparatus 1100. For example, a sensor module (or a portion of the sensor module) may be located in one or more locations, such as, but not limited to, along a sidewall of the chamber 1142, in the evacuation region 1104, adjacent to the process ring 1197, and integrated with the lid assembly 1110. Accordingly, detection of various chamber conditions in multiple locations through the processing apparatus 1100 may be determined. The chamber conditions supplied by the one or more sensor modules may be used to modify one or more parameters, such as, for example, processing recipe parameters, cleaning schedules for the processing apparatus 1100, component replacement determinations, and the like.

Figure 12:
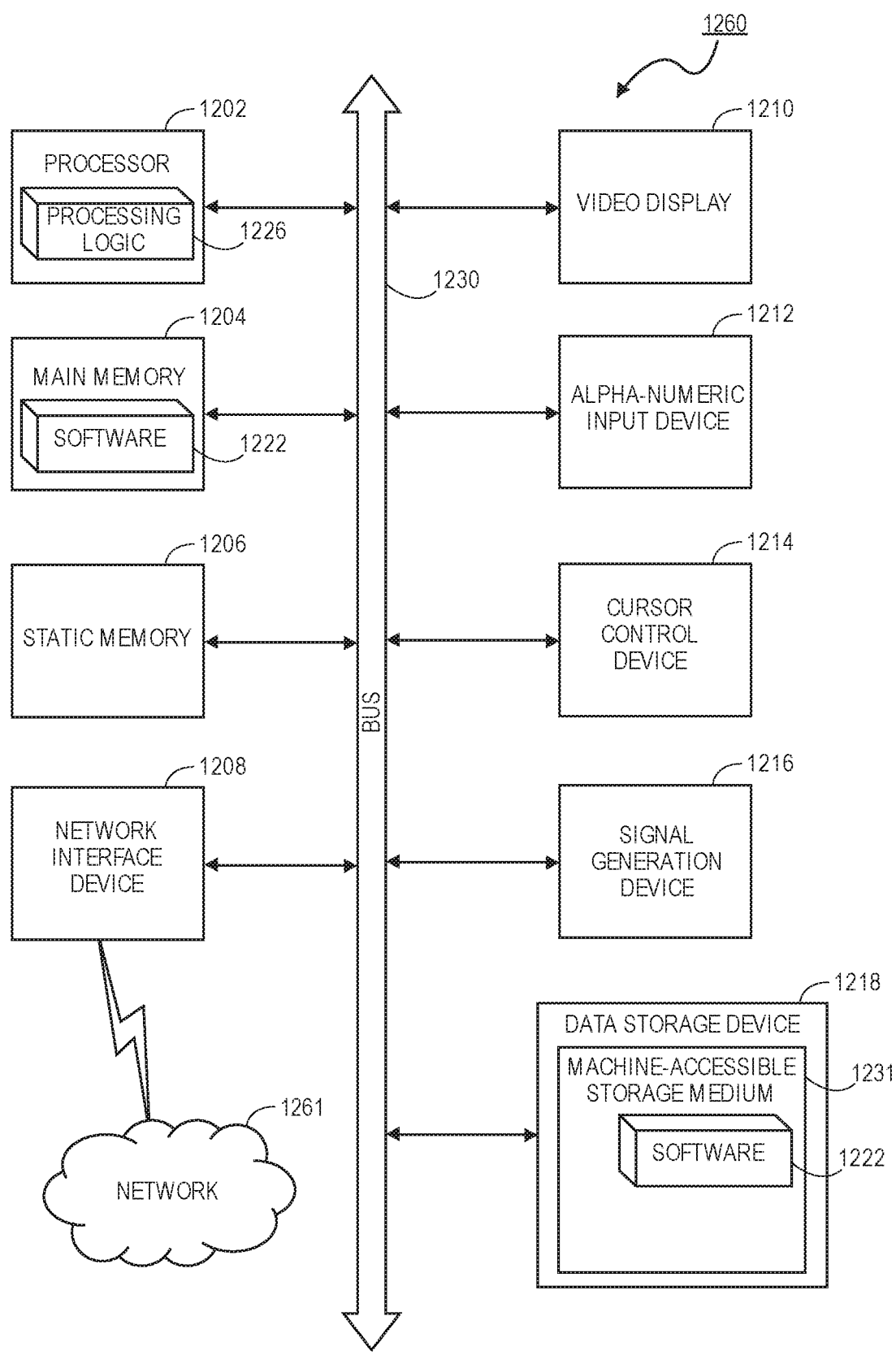
FIG. 12 illustrates a block diagram of an exemplary computer system that may be used in conjunction with a sensor module, in accordance with an embodiment.

Referring now to FIG. 12, a block diagram of an exemplary computer system 1260 of a processing tool is illustrated in accordance with an embodiment. In an embodiment, computer system 1260 is coupled to and controls processing in the processing tool. The computer system 1260 may be communicatively coupled to one or more sensor modules, such as those disclosed herein. The computer system 1260 may utilize outputs from the one or more sensor modules in order to modify one or more parameters, such as, for example, processing recipe parameters, cleaning schedules for the processing tool, component replacement determinations, and the like.

Computer system 1260 may be connected (e.g., networked) to other machines in a Local Area Network (LAN), an intranet, an extranet, or the Internet. Computer system 1260 may operate in the capacity of a server or a client machine in a client-server network environment, or as a peer machine in a peer-to-peer (or distributed) network environment. Computer system 1260 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1260, the term "machine" shall also be taken to include any collection of machines (e.g., computers) that individually or jointly execute a set (or multiple sets) of instructions to perform any one or more of the methodologies described herein.

Computer system 1260 may include a computer program product, or software 1222, having a non-transitory machine-readable medium having stored thereon instructions, which may be used to program computer system 1260 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1260 includes a system processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

System processor 1202 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1202 may also be one or more special-purpose processing devices such as an application specific integrated circuit (ASIC), a field programmable gate array (FPGA), a digital signal system processor (DSP), network system processor, or the like. System processor 1202 is configured to execute the processing logic 1226 for performing the operations described herein.

The computer system 1260 may further include a system network interface device 1208 for communicating with other devices or machines. The computer system 1260 may also include a video display unit 1210 (e.g., a liquid crystal display (LCD), a light emitting diode display (LED), or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium 1231 (or more specifically a computer-readable storage medium) on which is stored one or more sets of instructions (e.g., software 1222) embodying any one or more of the methodologies or functions described herein. The software 1222 may also reside, completely or at least partially, within the main memory 1204 and/or within the system processor 1202 during execution thereof by the computer system 1260, the main memory 1204 and the system processor 1202 also constituting machine-readable storage media. The software 1222 may further be transmitted or received over a network 1261 via the system network interface device 1208. In an embodiment, the network interface device 1208 may operate using RF coupling, optical coupling, acoustic coupling, or inductive coupling.

While the machine-accessible storage medium 1231 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

Example 1: a sensor, comprising: a substrate having a first surface and a second surface opposite from the first surface; a first electrode over the first surface of the substrate; a second electrode over the first surface of the substrate and adjacent to the first electrode; and a barrier layer over the first electrode and the second electrode.

Example 2: the sensor of Example 1, wherein the first electrode comprises a plurality of first fingers, and the second electrode comprises a plurality of second fingers, and wherein the first fingers are interdigitated with the second fingers.

Example 3: sensor of Example 1, wherein the second electrode is a ring that surrounds a perimeter of the first electrode.

Example 4: the sensor of Example 3, wherein the first electrode is a ring.

Example 5: the sensor of Example 1, wherein the first electrode is a first spiral and the second electrode is a second spiral, and wherein the first spiral interlocks with the second spiral.

Example 6: the sensor of Examples 1-5, further comprising: a guard ring around a perimeter of the first electrode and the second electrode.

Example 7: the sensor of Examples 1-6, further comprising: a third electrode over the first surface and adjacent to the second electrode, wherein the second electrode is between the first electrode and the third electrode.

Example 8: the sensor of Examples 1-7, further comprising: a support above the first surface of the substrate, wherein at least a portion of the first electrode and at least a portion of the second electrode is on the support.

Example 9: the sensor of Example 8, wherein an air cavity is between the support and the first surface of the substrate.

Example 10: the sensor of Example 8, wherein a support structure is below the support, wherein the support structure has a first dielectric constant that is less than a second dielectric constant of the substrate.

Example 11: the sensor of Example 1-10, further comprising: a first conductive path from the first surface of the substrate to the second surface of the substrate that is connected to the first electrode; a second conductive path from the first surface of the substrate to the second surface of the substrate that is connected to the second electrode.

Example 12: the sensor of Examples 1-11, wherein the substrate comprises one or more of silicon, silicon oxide, aluminum oxide, and aluminum nitride.

Example 13: the sensor of Examples 1-12, wherein the substrate comprises a ceramic.

Example 14: the sensor of Example 1-12, wherein the substrate is flexible.

Example 15: the sensor of Examples 1-14, wherein the first electrode and the second electrode comprise one or more of aluminum, molybdenum, tungsten, titanium, tantalum, nickel, and chromium.

Example 16: the sensor of Examples 1-15, wherein the barrier layer is a conformal layer over the first electrode, the second electrode, and the first surface of the substrate.

Example 17: sensor of Examples 1-16, wherein the barrier layer is a diffusion barrier, and wherein the barrier layer is resistant to fluorination.

Example 18: the sensor of Example 17, wherein the barrier layer comprises one or more of a metallic oxide, a metallic fluoride, and a metallic oxyfluoride.

Example 19: the sensor of Example 18, wherein the barrier layer comprises one or more of aluminum oxide, magnesium oxide, yttrium oxyfluoride, yttrium zirconium oxyfluoride, yttrium aluminum oxide, and hafnium oxide.

Example 20: the sensor of Examples 1-19, wherein the barrier layer comprises a first barrier layer and a second barrier layer, wherein the first barrier layer and the second barrier layer have different compositions.

Example 21: the sensor of Example 20, wherein the first barrier layer is plasma resistant, and wherein the second barrier layer is a diffusion barrier.

Example 22: the sensor of Examples 1-21, further comprising: a thermal sensor disposed over the second surface of the substrate.

Example 23: a sensor module, comprising: a sensor substrate with a first surface and a second surface opposite from the first surface; a first electrode over the first surface of the sensor substrate; a second electrode over the first surface of the sensor substrate and adjacent to the first electrode; and a capacitance-to-digital converter (CDC) electrically coupled to the first electrode and the second electrode.

Example 24: the sensor module of Example 23, wherein the CDC is attached to the second surface of the sensor substrate.

Example 25: sensor module of Example 24, further comprising: a first conductive path through the sensor substrate for electrically coupling the first electrode to the CDC; and a second conductive path through the sensor substrate for electrically coupling the second electrode to the CDC.

Example 26: the sensor module of Examples 23-25, wherein the CDC comprises a temperature sensor.

Example 27: the sensor module of Examples 23-26, further comprising: a temperature sensor over the second surface of the sensor substrate.

Example 28: the sensor module of Examples 23-27, wherein the sensor substrate is mounted onto a package substrate.

Example 29: a processing tool, comprising: a chamber defining an interior volume, wherein the interior volume comprises a processing region and an evacuation region; a lid to seal the chamber; a substrate support within the processing region, the substrate support for supporting a substrate and a process ring; and a capacitive sensor within the interior volume, wherein the capacitive sensor comprises: a substrate having a first surface and a second surface opposite from the first surface; a first electrode over the first surface of the substrate; a second electrode over the first surface of the substrate and adjacent to the first electrode; and a barrier layer over the first electrode and the second electrode.

Example 30: the processing tool of Example 29, wherein the first electrode and the second electrode are electrically coupled to a capacitance-to-digital converter (CDC).

Example 31: the processing tool of Example 30, wherein the CDC is attached to the second surface of the substrate.

Example 32: the processing tool of Examples 29-31, wherein the first electrode and the second electrode are spaced away from the first surface of the substrate by a support.

Example 33: the processing tool of Examples 29-32, wherein the first electrode comprises a plurality of first fingers, and the second electrode comprises a plurality of second fingers, and wherein the first fingers are interdigitated with the second fingers.

Example 34: the processing tool of Examples 29-33, wherein the substrate is circular.

Example 35: the processing tool of Examples 29-34, further comprising a notch in the circular substrate.

Example 36: the processing tool of Examples 29-35, wherein a housing for the capacitive sensor passes through a sidewall of the chamber.

Example 37: the processing tool of Examples 29-35, wherein a housing for the capacitive sensor passes through the lid.

Example 38: the processing tool of Examples 29-35, wherein the capacitive sensor is adjacent to the process ring.

Example 39: the processing tool of Examples 29-35, wherein the capacitive sensor is within the evacuation region of the interior volume.

Example 40: the processing tool of Examples 29-39, wherein the processing tool is a plasma etch chamber, a plasma enhanced chemical vapor deposition chamber, a physical vapor deposition chamber, a plasma treatment chamber, or an ion implantation chamber.

Example 41: a method of forming a sensor, comprising: forming vias through a substrate; forming a first pad and a second pad on a first surface of the substrate; forming a first electrode and a second electrode on a second surface of the substrate, wherein the first pad is electrically coupled to the first electrode by one of the vias, and the second pad is electrically coupled to the second electrode by one of the vias; forming a passivation layer over the first electrode, the second electrode, and the second surface; and singulating the substrate.

Example 42: the method of Example 41, wherein the substrate is reformatted from a panel form factor to a wafer form factor after the vias, the first pad, and the second pad are formed.

Example 43: the method of Example 41 or Example 42, wherein the passivation layer is formed with a conformal deposition process.

Example 44: the method of Examples 41-43, wherein the singulation provides a sensor substrate with a circular shape.

Example 45: the method of Examples 41-44, wherein the sensor substrate comprises a notch.

Example 46: the method of Examples 41-45, wherein singulating the substrate comprises a laser singulation process.

Example 47: the method of Examples 41-46, wherein the first electrode and the second electrode are patterned from a blanket layer over the second surface of the substrate.

Example 48: the method of Examples 41-47, wherein the first electrode and the second electrode comprise interdigitated fingers.

Example 49: the method of Examples 41-47, wherein the second electrode forms a ring around a perimeter of the first electrode.

Example 50: the method of Examples 41-49, wherein a plurality of sensors are fabricated on the substrate substantially in parallel.

What is claimed is:

1. A sensor module, comprising:
    a sensor substrate with a first surface and a second surface opposite from the first surface;
    a first electrode over the first surface of the sensor substrate;
    a second electrode over the first surface of the sensor substrate and adjacent to the first electrode;
    a barrier layer over the first electrode and the second electrode, wherein the barrier layer is continuous between the first electrode and the second electrode, and wherein the barrier layer is a conformal layer having a thickness over top surfaces of the first and second electrodes substantially the same as a thickness over sidewall surfaces of the first and second electrodes;
    a capacitance-to-digital converter (CDC) electrically coupled to the first electrode and the second electrode, wherein the CDC is attached to the second surface of the sensor substrate;
    a first conductive path through the sensor substrate for electrically coupling the first electrode to the CDC; and
    a second conductive path through the sensor substrate for electrically coupling the second electrode to the CDC.

2. The sensor module of claim 1, wherein the CDC comprises a temperature sensor.

3. The sensor module of claim 1, further comprising:
    a temperature sensor over the second surface of the sensor substrate.

4. The sensor module of claim 1, wherein the first electrode comprises a plurality of first fingers, and the second electrode comprises a plurality of second fingers, and wherein the first fingers are interdigitated with the second fingers.

5. The sensor module of claim 1, wherein the second electrode is a ring that surrounds a perimeter of the first electrode.

6. The sensor module of claim 1, wherein the first electrode is a first spiral and the second electrode is a second spiral, and wherein the first spiral interlocks with the second spiral.

7. The sensor module of claim 1, further comprising:
    a guard ring around a perimeter of the first electrode and the second electrode.

8. The sensor module of claim 1, further comprising:
    a third electrode over the first surface and adjacent to the second electrode, wherein the second electrode is between the first electrode and the third electrode.

9. The sensor module of claim 1, further comprising:
    a support above the first surface of the substrate, wherein at least a portion of the first electrode and at least a portion of the second electrode is on the support.

10. The sensor module of claim 9, wherein an air cavity is between the support and the first surface of the substrate.

11. The sensor module of claim 10, wherein a support structure is below the support, wherein the support structure has a first dielectric constant that is less than a second dielectric constant of the substrate.

12. The sensor module of claim 1, wherein the barrier layer is a conformal layer over the first electrode, the second electrode, and the first surface of the substrate.

13. The sensor module of claim 1, wherein the barrier layer comprises one or more of a metallic oxide, a metallic fluoride, and a metallic oxyfluoride.

* * * * *